United States Patent
Balcerek et al.

(10) Patent No.: US 8,131,485 B2
(45) Date of Patent: Mar. 6, 2012

(54) METHOD FOR FAULT LOCATION IN ELECTRIC POWER LINES

(75) Inventors: Przemyslaw Balcerek, Wroclaw (PL); Marek Fulczyk, Kedzierzyn-Kozle (PL); Eugeniusz Rosolowski, Wroclaw (PL); Jan Izykowski, Wroclaw (PL); Murari Saha, Vasteras (SE)

(73) Assignee: ABB Technology AG, Zurich (CH)

( * ) Notice: Subject to any disclaimer, the term of this patent is extended or adjusted under 35 U.S.C. 154(b) by 259 days.

(21) Appl. No.: 11/991,130

(22) PCT Filed: Sep. 5, 2006

(86) PCT No.: PCT/PL2006/000061
§ 371 (c)(1),
(2), (4) Date: Jul. 17, 2008

(87) PCT Pub. No.: WO2007/032697
PCT Pub. Date: Mar. 22, 2007

(65) Prior Publication Data
US 2009/0150099 A1 Jun. 11, 2009

(30) Foreign Application Priority Data

Sep. 14, 2005 (PL) .......................... 377064
Jun. 23, 2006 (PL) .......................... 380012

(51) Int. Cl.
*G01R 31/00* (2006.01)
(52) U.S. Cl. ........................................ 702/59
(58) Field of Classification Search ............. 702/57–59, 702/64, 65, 149, 181, 183, 185; 324/500, 324/531, 600
See application file for complete search history.

(56) References Cited

U.S. PATENT DOCUMENTS
4,766,549 A * 8/1988 Schweitzer et al. ............ 702/59

FOREIGN PATENT DOCUMENTS
EP 0464662 A1 1/1992

OTHER PUBLICATIONS

Chi-Shan Yu et al, "A Fault Location Algorithm For Transmission Lines With Tapped Leg-PMU Based Approach", 2001 IEEE Power Engineering Society. Summer Meeting. Conference Proceedings. Vancouver, Canada, Jul. 15-19, 2001, IEEE Power Engineering Society, New York, NY: IEEE, US, vol. 2 of 3, Jul. 15, 2001, pp. 915-920, XP010567853, ISBN: 0-7803-7173-9, p. 915, col. 1-p. 916, col. 1.

(Continued)

*Primary Examiner* — Mohamed Charioui
(74) *Attorney, Agent, or Firm* — Michael M. Rickin

(57) ABSTRACT

A method for locating faults in three-terminal and multi-terminal power lines, applicable in electric power systems for overhead and underground cable transmission and distribution lines. The inventive method is characterized in that it measures current for fault and pre-fault conditions and in one terminal station of the system line phase voltage for fault and pre-fault conditions is measured, a hypothetical fault location is assumed, the distances to the hypothetical fault locations are calculated and fault resistance is calculated, the actual fault point is selected by first comparing the numerical values concerning the distances to the hypothetical fault locations and rejecting those results whose numerical values are negative or bigger than one in relative units, and then by analysing the values of the calculated fault resistances for the fault locations and rejecting those results of the calculations for which the value of fault resistance is negative, and if there is still more than one calculation result remains not rejected then performing selection of the valid result by analysing the values of the calculated respective equivalent source impedances.

10 Claims, 10 Drawing Sheets

OTHER PUBLICATIONS

Ying-Hong Lin et al: "A New Fault Locator for Three-Terminal Transmission Lines—Using Two-Terminal Synchronized Voltage and Current Phasors", IEEE Transactions on Power Delivery, IEEE Serivce Center, New York, NY, US, vol. 17, No. 2, 2002, pp. 452-459, XP011078798, ISSN: 0885-8977, p. 452, col. 1-p. 453, col. 2.

Kai-Ping Lien et al: "A Novel Fault Location Algorithm For Multi-Terminal Lines Using Phasor Measurement Units", Power Symposium, 2005. Proceedings of the 37th annual North American Ames, IA, USA, Oct. 23-25, 2005, Piscataway, NJ, USA, IEEE, Oct. 23, 2005, pp. 576-581, XP010865525, ISBN: 0-7803-9255-8, cited in the application, p. 576, col. 1-p. 578, col. 1.

European Patent Office, International Search Report, WO PCT/PL2006/000061 dated Feb. 7, 2007, pp. 1-3 and having a mail date of Feb. 14, 2007 in U.S. Appl. No. 11/991,130, Balcerek et al.

* cited by examiner

METHOD FOR FAULT LOCATION IN ELECTRIC POWER LINES

The present invention is concerned with a method for fault location in electric power lines applicable both to three-terminal power lines and multiple-terminal power lines, fit to be used in the power industry for overhead and overhead-cable transmission or distribution lines.

The accurate location of the fault in electric power lines is of great importance both for power companies dealing with electric energy distribution and for end users of electric energy. Quick and exact location of the fault point effects the quality of transmitted electric energy and its reliable and uninterrupted supply. In most cases, faults result in mechanical damage which must be removed before voltage is restored in the line. Quick rectification of a fault is possible if the place of the fault is known exactly. The simplest method for determining the location of a fault is searching along the line. This method is slow and expensive, even dangerous in adverse weather conditions. Fault locators facilitating quick determination of the fault point are used for locating fault points. A fault locator is usually a part of a digital protective relay located in power stations or substations. Depending on the type of electric power lines: parallel lines, three-terminal power lines, multiple-terminal power lines, and depending on the location of final terminals and the diversity of measuring signals, different ways of fault location are distinguished.

A system and a method for fault location in a three-terminal power line is known from U.S. Pat. No. 6,466,030. The method according to that invention consists in dividing the transmission line in the tap point into two sections, the supply side section and the receiving side section, and on both sides of both sections at their ends instruments for measuring the values of current and voltage signals are installed. Then, on the basis of synchronously or asynchronously measured values and the model of fault loops, the load impedance in the branch is calculated, after which the first hypothetical fault location is calculated assuming that the fault occurred on the supply section side. Depending on whether the measurements are synchronised or not, either the phase angle is calculated, which is the measure of displacement with time of the measured samples from signals from both ends of the line on the basis of measured pre-fault signals, or a phase angle equal to zero for synchronous measurements is assumed. Then calculations of the second hypothetical fault location in the second line section between the tap point and the received point are made. From the two calculated hypothetical locations one value which is contained in a specific interval of expected values, i.e. numerical values from 0 to 1 in relative units is chosen. The described solution applies to the case of a single circuit line with a passive branch, which means that in the adopted equivalent circuit diagram of such system, in the tapped line, the presence of electric-power motive force is not considered, and the load impedance of this line can be calculated from pre-fault measurements.

A system and a method for fault location in a multiple-terminal parallel transmission line is known from U.S. Pat. No. 5,485,394. In the method according to that invention, a multi-terminal transmission system is equalled to a three-terminal transmission system. For such system differential current amplitudes are calculated in each station, and then the distance to the fault point is calculated from their relations.

A method for fault location using voltage and current phasor measurement in all stations at the ends of a multi-terminal line is known from the publication "Novel Fault Location Algorithm for Multi-Terminal Lines Using Phasor Measurement Units" published in the materials of the Thirty-Seventh Annual North American Power Symposium in Ames, Iowa, USA, Oct. 23-25, 2005. That method consists in reducing a multi-section transmission line to systems of two-terminal lines assuming that the fault is located in one of these sections and then hypothetical fault locations are calculated for this assumption. Next, calculations of successive hypothetical fault locations are made assuming that the fault is located in further successive sections of the line. One value, which is contained in a specific interval of expected values and which indicates the actual place of the fault, is selected from the hypothetical locations calculated in this way.

THE ESSENCE OF THE INVENTION

The essence of the inventive method for locating faults in electric power lines by dividing the lines of the transmission or distribution system into sections and assuming the hypothetical location of the fault on at least one of these sections consists in the following:

current for fault condition and pre-fault condition is measured in all terminal stations of the system, the line phase voltage for fault and pre-fault conditions is measured in one terminal station of the system, the symmetrical components of the measured current and voltage signals as well as the total fault current in the fault point are calculated, the first hypothetical fault point located in the line section between the beginning of the line and the first tap point, the second hypothetical fault point located in the line section between the end of the line and the last tap point of the branch, and a successive hypothetical fault point which is located in the branch are assumed, additionally assuming successive hypothetical fault points located in the line sections between two consecutive tap points for a multi-terminal line, the distance from the beginning of the line to the fault point, the distance from the end of the line to the fault point and the distance from the end of the tapped line to the fault point located in this branch are calculated and, for a multi-terminal line, the distance from the tap point to the fault point located in the line section between two tap points is additionally calculated, and then for all hypothetical fault points in each section fault resistance is calculated, the actual fault point is selected by first comparing the numerical values concerning the previously determined distances and rejecting those results whose numerical values are negative or bigger than 1 in relative units and then, by analysing the fault resistance values calculated for fault points and rejecting those results for which the fault resistance is negative, after which if it is found that only one numerical value concerning the distance is contained within the interval from zero to one in relative units and the value of the calculated fault resistance for this distance to the fault point is positive or equal to zero, these results are final results and they indicate the actual distance to the fault point and the fault resistance value in the fault point, if, after the selection of the actual fault point, it turns out that at least two numerical values concerning the previously calculated distances are contained within the numerical interval from zero to one in relative units and the values of the calculated fault resistance for these fault points are positive or equal to zero, then impedance modules or impedances of equivalent source systems are determined for the negative sequence component for phase-to-ground faults, phase-to-phase faults and phase-to-phase-to-ground faults or for the incremental positive sequence component for three-phase faults and on the assumption that the fault occurred in a definite section, and during the impedance determination it is additionally checked whether the calculated values of the impedance of equivalent source systems are contained in the first quadrant of the Cartesian co-ordinate system for the complex plain and these distances to fault points are rejected for which impedance values are not contained in this quadrant of the system, and if it turns out that only one value of the impedance of the equivalent source system concerning distance is contained in the first quadrant of the system, then the result of the calculation of the distance to the fault point, for this impedance, is considered to be final, whereas if it turns out that at least two values of the impedance of equivalent source systems concerning distance are contained in the first quadrant of the system, then the modules of these impedances are determined, the values of the modules of the equivalent source impedance are compared with realistic values, which really define the system load, and the distance for which the value of the module of the equivalent source impedance is nearest to the realistic values, really determining the system load, is considered to be the final result.

Preferably, calculation of the total fault current is done taking into account the share coefficients determining the relation between the symmetrical components of the total fault current when voltage drop across the fault resistance is estimated, a specially determined set of these coefficients being used for that operation.

Preferably, for phase-to-phase-to-earth faults the positive sequence component is eliminated in the estimation of the total fault current, and for the negative and zero sequence components the following values of the share coefficients determining the relation between the symmetrical components of the total fault current when voltage drop across the fault resistance is estimated are assumed, in particular for a-b-g fault:

$$a_{F1} = 0,$$

$$a_{F2} = a_{F2}^{init.} - \frac{a_{F1}^{init.} b_{F2}}{b_{F1}},$$

$$a_{F0} = \frac{a_{F1}^{init.}}{b_{F1}}$$

whereas:

$$a_{F1}^{init.} = 1 - a^2,$$

$$a_{F2}^{init.} = 1 - a,$$

$$b_{F1} = -a,$$

$$b_{F2} = -a^2,$$

$$a = \exp^{j2\pi/3} = -0,5 + j\frac{\sqrt{3}}{2},$$

Preferably, for three-terminal power lines, the distances from the beginning of the line to the fault point $d_A$, from the end of the line to the fault point $d_B$, from the end of the tapped line to the fault point $d_C$ are determined from the following equations:

$$d_A = \frac{\text{real}(\underline{V}_{AP})\text{imag}(\underline{I}_F) - \text{imag}(\underline{V}_{AP})\text{real}(\underline{I}_F)}{\text{real}(\underline{Z}_{1LA}\underline{I}_{AP})\text{imag}(\underline{I}_F) - \text{imag}(\underline{Z}_{1LA}\underline{I}_{AP})\text{real}(\underline{I}_F)},$$

$$d_B = \frac{-\text{real}(\underline{V}_{Tp} - \underline{Z}_{1LB}\underline{I}_{TBp})\text{imag}(\underline{I}_F) + \text{imag}(\underline{V}_{Tp} - \underline{Z}_{1LB}\underline{I}_{TBp})\text{real}(\underline{I}_F)}{\text{real}(\underline{Z}_{1LB}\underline{I}_{TBp})\text{imag}(\underline{I}_F) - \text{imag}(\underline{Z}_{1LB}\underline{I}_{TBp})\text{real}(\underline{I}_F)},$$

$$d_C = \frac{-\text{real}(\underline{V}_{Tp} - \underline{Z}_{1LC}\underline{I}_{TCp})\text{imag}(\underline{I}_F) + \text{imag}(\underline{V}_{Tp} - \underline{Z}_{1LC}\underline{I}_{TCp})\text{real}(\underline{I}_F)}{\text{real}(\underline{Z}_{1LC}\underline{I}_{TCp})\text{imag}(\underline{I}_F) - \text{imag}(\underline{Z}_{1LC}\underline{I}_{TCp})\text{real}(\underline{I}_F)},$$

where:

"real" denotes the real part of the given quantity,

"imag" denotes the imaginary part of the given quantity, $V_{Ap}$—denotes the fault loop voltage determined assuming that the fault occurred in section LA, $V_{Tp}$—denotes the fault loop voltage determined assuming that the fault occurred in section LB or LC, $I_{Ap}$—denotes the fault loop current determined assuming that the fault occurred in section LA, $I_{TBp}$—denotes the fault loop current determined assuming that the fault occurred in section LB, $I_{TCp}$—denotes the fault loop current determined assuming that the fault occurred in line section LC, $I_F$—denotes total fault current, $Z_{1LA}=R_{1LA}+j\omega_1 L_{1LA}$—denotes impedance of the line section LA for the positive sequence, $Z_{1LB}=R_{1LB}+j\omega_1 L_{1LB}$—denotes impedance of the line section LB for the positive sequence, $Z_{1LC}=R_{1LC}+j\omega_1 L_{1LC}$—denotes impedance of the line section LC for the positive sequence, $R_{1LA}$, $R_{1LB}$, $R_{1LC}$—resistance for the positive sequence for line sections LA, LB, LC, respectively, $L_{1LA}$, $L_{1LB}$, $L_{1LC}$—inductance for the positive sequence for line sections LA, LB, LC, respectively, $\omega_1$—pulsation for the fundamental frequency.

Preferably, for three-terminal power lines, the fault resistance $R_{FA}$, $R_{FB}$, $R_{FC}$ is determined from the following equations:

$$R_{FA} = \frac{1}{2}\left[\frac{\text{real}(\underline{V}_{Ap}) - d_A\text{real}(\underline{Z}_{1LA}\underline{I}_{Ap})}{\text{real}(\underline{I}_F)} + \frac{\text{imag}(\underline{V}_{Ap}) - d_A\text{imag}(\underline{Z}_{1LA}\underline{I}_{Ap})}{\text{imag}(\underline{I}_F)}\right],$$

$$R_{FB} = \frac{1}{2}\left[\frac{\text{real}(\underline{V}_{Tp}) - (1 - d_B)\cdot\text{real}(\underline{Z}_{1LB}\underline{I}_{TBp})}{\text{real}(\underline{I}_F)}\right] +$$

$$\frac{1}{2}\left[\frac{\text{imag}(\underline{V}_{Tp}) - (1 - d_B)\cdot\text{imag}(\underline{Z}_{1LB}\underline{I}_{TBp})}{\text{imag}(\underline{I}_F)}\right]$$

$$R_{FC} = \frac{1}{2}\left[\frac{\text{real}(\underline{V}_{Tp}) - (1 - d_C)\cdot\text{real}(\underline{Z}_{1LC}\underline{I}_{TCp})}{\text{real}(\underline{I}_F)}\right] +$$

$$\frac{1}{2}\left[\frac{\text{imag}(\underline{V}_{Tp}) - (1 - d_C)\cdot\text{imag}(\underline{Z}_{1LC}\underline{I}_{TCp})}{\text{imag}(\underline{I}_F)}\right]$$

where:

"real" denotes the real part of the given quantity,

"imag" denotes the imaginary part of the given quantity, $V_{Ap}$—denotes the fault loop voltage calculated assuming that the fault occurred in section LA, $V_{Tp}$—denotes the fault loop voltage calculated assuming that the fault occurred in section LB or LC, $I_{Ap}$—denotes the fault loop current calculated assuming that the fault occurred in section LA, $I_{TBp}$—denotes the fault loop current calculated assuming that the fault occurred in section LB, $I_{TCp}$—denotes the fault loop current calculated assuming that the fault occurred in line section LC, $I_F$—denotes the total fault current, $\underline{Z}_{1LA} = R_{1LA} + j\omega_1 L_{1LA}$—denotes impedance of the line section LA for the positive sequence, $\underline{Z}_{1LB} = R_{1LB} + j\omega_1 L_{1LB}$—denotes impedance of the line section LB for the positive sequence, $\underline{Z}_{1LC} = R_{1LC} + j\omega_1 L_{1LC}$—denotes impedance of the line section LC for the positive sequence, $R_{1LA}$, $R_{1LB}$, $R_{1LC}$—resistance for the positive sequence for line sections LA, LB, LC, respectively, $L_{1LA}$, $L_{1LB}$, $L_{1LC}$—inductance for the positive sequence for line sections LA, LB, LC, respectively, $\omega_1$—pulsation for the fundamental frequency.

$d_A$—denotes the distance from the beginning of the line to the fault point, $d_B$—denotes the distance from the end of the line to the fault point, $d_C$—denotes the distance from the end of the tapped line to the fault point.

Preferably, for three-terminal power lines, the equivalent source impedance for the negative sequence component $((\underline{Z}_{2SB})_{SUB\_A})$ and for the incremental positive sequence component $((\underline{Z}_{\Delta 1SB})_{SUB\_A})$ are calculated assuming that the fault occurred in LA line section, as per this equation:

$$(\underline{Z}_{iSB})_{SUB\_A} = \frac{G_{iA} I_{A2} - H_{iA} I_{FAi}}{Q_{BCi}(I_{FAi} - I_{Ai})}.$$

where:

the lower index i takes on values i=2 for the negative sequence, i=Δ1 for the incremental positive sequence component, $G_{iA}$—denotes the first analytical coefficient for the negative sequence component, determined from the analysis of an equivalent circuit diagram of the system as shown in FIG. 11 and/or for the incremental positive sequence component analytically determined from the equivalent circuit diagram of the system as shown in FIG. 12, $I_{Ai}$—denotes the negative and/or incremental positive sequence component of current measured at the beginning of the line, $H_{iA}$—denotes the second analytical coefficient for the negative sequence component, determined from the analysis of an equivalent circuit diagram of the system as shown in FIG. 11 and/or the incremental positive sequence component analytically determined from the equivalent circuit diagram of the system as shown in FIG. 12, $I_{FAi}$—denotes the negative sequence component of the total fault current, determined from the analysis of an equivalent circuit diagram of the system as shown in FIG. 11 and/or the incremental positive sequence component of the total fault current, determined from the analysis of an equivalent circuit diagram of the system as shown in FIG. 12, $Q_{BCi}$—denotes the quotient of the negative sequence component of current measured at the end of the line and the sum of the negative sequence components of current signals measured at the end of the line and at the end of the tapped line and/or the quotient of the incremental positive sequence component of current measured at the end of the line and the sum of the incremental positive sequence components of current signals measured at the end of the line and at the end of the tapped line.

Preferably, for three-terminal power lines, the equivalent source impedance $((\underline{Z}_{2SC})_{SUB\_A})$ for the negative sequence component and $((\underline{Z}_{\Delta 1SC})_{SUB\_A})$ for the incremental positive sequence component are calculated assuming that the fault occurred in line section LA, from the following equation:

$$(\underline{Z}_{iSC})_{SUB\_A} = \left(\underline{Z}_{iLB} + (\underline{Z}_{iSB})_{SUB\_A}\right)\frac{I_{Bi}}{I_{Ci}} - \underline{Z}_{iLC}.$$

where:

the lower index i takes on values i=2 for the negative sequence component, i=Δ1 for the incremental positive sequence component, $(\underline{Z}_{iSB})_{SUB\_A}$—denotes equivalent source impedance for the negative sequence component and/or the incremental positive sequence component, calculated assuming that the fault occurred in line section LA, $\underline{Z}_{iLB}$—denotes the impedance of line section LB for the negative sequence component and/or the positive sequence component, where: $\underline{Z}_{\Delta 1LB} = \underline{Z}_{1LB}$, $\underline{Z}_{1LB}$—denotes the impedance of line section LB for the positive sequence component, $\underline{Z}_{iLC}$—denotes the impedance of line section LC for the negative sequence component and/or impedance of line section LC for the incremental positive sequence component, where $\underline{Z}_{2LC} = \underline{Z}_{1LC}$ and $\underline{Z}_{\Delta 1LC} = \underline{Z}_{1LC}$, $\underline{Z}_{1LC}$—denotes the impedance of line section LC for the positive sequence component, $I_{Bi}$—denotes the negative sequence component and/or the incremental positive sequence component of current measured at the end of the line, $I_{Ci}$—denotes the negative sequence component and/or the incremental positive sequence component of current measured at the end of the branch.

Preferably, for three-terminal power lines, equivalent source impedance for the negative sequence component $(\underline{Z}_{2SB})_{SUB\_B}$ and for the incremental positive sequence component $(\underline{Z}_{\Delta 1SB})_{SUB\_B}$ is determined assuming that the fault occurred in line section LB, from the following equation:

$$(\underline{Z}_{iSB})_{SUB\_B} = \frac{(1-d_B)\underline{Z}_{iLB} I_{TBi}^{transf.} - d_B \underline{Z}_{iLB} I_{Bi} - V_{Ti}^{transf.}}{I_{Bi}}$$

where:

the lower index i takes on values i=2 for the negative sequence component, i=Δ1 for the incremental positive sequence component, $d_B$—denotes the distance from the end of the line to the fault point, $\underline{Z}_{iLB}$—denotes the impedance of line section LB for the negative sequence component and/or for the positive sequence component, where $\underline{Z}_{2LB} = \underline{Z}_{1LB}$ and $\underline{Z}_{\Delta 1LB} = \underline{Z}_{1LB}$, $\underline{Z}_{1LB}$—denotes the impedance of line section LB for the positive sequence component, $I_{TBi}^{transf.}$—denotes current flowing from a tap point T to line section LB for the negative sequence component and/or for the incremental positive sequence component, $I_{Bi}$—denotes the negative sequence component and/or the incremental positive sequence component of current measured at the end of the line, $V_{Ti}^{transf.}$—denotes voltage in the tap point T for the negative sequence component and/or for the incremental positive sequence component.

Preferably, for three-terminal power lines, equivalent source impedance for the negative sequence component $(Z_{2SC})_{SUB\_B}$ and for the incremental positive sequence component $(Z_{\Delta1SC})_{SUB\_B}$ is calculated assuming that the fault occurred in line section LB, from the following equation:

$$(Z_{iSC})_{SUB\_B} = -\frac{V_{Ci}}{I_{Ci}}$$

where:
the lower index i takes on values i=2 for the negative sequence component, i=Δ1 for the incremental positive sequence component,
$V_{Ci}$—denotes the calculated negative sequence component and/or the incremental positive sequence component of voltage at the end of the tapped line,
$I_{Ci}$—denotes the negative sequence component and/or the incremental positive sequence component of current measured at the end of the branch.

Preferably, for three-terminal power lines, equivalent source impedance for the negative sequence component $(Z_{2SC})_{SUB\_C}$ and for the incremental positive sequence component $(Z_{\Delta1SC})_{SUB\_C}$ is calculated assuming that the fault occurred in line section LC, from the following equation:

$$(Z_{iSC})_{SUB\_C} = \frac{(1-d_C)Z_{iLC}I_{TCi}^{transf.} - d_C Z_{iLC}I_{Ci} - V_{Ti}^{transf.}}{I_{Ci}}$$

where:
the lower index i takes on values i=2 for the negative sequence component, i=Δ1 for the incremental positive sequence component,
$d_C$—denotes the distance from the end of the tapped line to the fault point,
$Z_{iLC}$—denotes impedance of the line section LC for the negative sequence component and/or for the incremental positive sequence component, where $Z_{2LC}=Z_{1LC}$ and $Z_{\Delta1LC}=Z_{1LC}$,
$Z_{1LC}$—denotes impedance of the line section LC for the positive sequence component,
$I_{TCi}^{transf.}$—denotes current flowing from the tap point T to line section LC for the negative sequence component and/or for the incremental positive sequence component,
$I_{Ci}$—denotes the negative sequence component and/or the incremental positive sequence component of current measured at the end of the branch,
$V_{Ti}^{transf.}$—denotes voltage at the tap point T for the negative sequence component and/or for the incremental positive sequence component.

Preferably, for three-terminal power lines, equivalent source impedance for the negative sequence component $(Z_{2SB})_{SUB\_C}$ and for the incremental positive sequence component $(Z_{\Delta1SB})_{SUB\_C}$ is calculated from the following equation assuming that the fault occurred in line section LC:

$$(Z_{iSB})_{SUB\_C} = -\frac{V_{Bi}}{I_{Bi}}$$

where:
the lower index i takes on values i=2 for the negative sequence component, i=Δ1 for the incremental positive sequence component,
$V_{Bi}$—denotes the calculated negative sequence and/or the incremental positive sequence component of voltage at the end of the line,
$I_{Bi}$—denotes the negative sequence and/or the incremental positive sequence component of current measured at the end B of the line.

Preferably, for multi-terminal power lines, distances from the beginning of the line to the fault point ($d_1$), from the end of the line to the fault point ($d_{(2n-3)}$), from the end of the line to the fault point ($d_{(2k-2)}$), from the tap point to the fault point in the line section between two tap points ($d_{(2k-1)}$) are determined from the following equations:

$$d_1 = \frac{\text{real}(V_{1p})\text{imag}(I_F) - \text{imag}(V_{1p})\text{real}(I_F)}{\text{real}(Z_{1L1}I_{1p})\text{imag}(I_F) - \text{imag}(Z_{1L1}I_{1p})\text{real}(I_F)},$$

$$d_{(2n-3)} = \frac{\begin{array}{c}-\text{real}(V_{T(n-1)np} - Z_{1L(2n-3)}I_{T(n-1)np})\text{imag}(I_F) + \\ \text{imag}(V_{T(n-1)np} - Z_{1L(2n-3)}I_{T(n-1)np})\text{real}(I_F)\end{array}}{\begin{array}{c}\text{real}(Z_{1L(2n-3)}I_{T(n-1)np})\text{imag}(I_F) - \\ \text{imag}(Z_{1L(2n-3)}I_{T(n-1)np})\text{real}(I_F)\end{array}}$$

$$d_{(2k-2)} = \frac{\begin{array}{c}-\text{real}(V_{Tkkp} - Z_{1L(2k-2)}I_{Tkkp})\text{imag}(I_F) + \\ \text{imag}(V_{Tkkp} - Z_{1L(2k-2)}I_{Tkkp})\text{real}(I_F)\end{array}}{\begin{array}{c}\text{real}(Z_{1L(2k-2)}I_{Tkkp})\text{imag}(I_F) - \\ \text{imag}(Z_{1L(2k-2)}I_{Tkkp})\text{real}(I_F)\end{array}},$$

$$d_{(2k-1)} = \frac{\begin{array}{c}-\text{real}(V_{TkT(k+1)p} - Z_{1L(2k-1)}I_{TkT(k+1)p})\text{imag}(I_F) + \\ \text{imag}(V_{TkT(k+1)p} - Z_{1L(2k-1)}I_{TkT(k+1)p})\text{real}*(I_F)\end{array}}{\begin{array}{c}\text{real}(Z_{1L(2k-1)}I_{TkT(k+1)p})\text{imag}(I_F) - \\ \text{imag}(Z_{1L(2k-1)}I_{TkT(k+1)p})\text{real}(I_F)\end{array}}$$

where:
"real" denotes the real part of the given quantity,
"imag" denotes the imaginary part of the given quantity,
$V_{1p}$—fault loop voltage calculated under assumption that fault occurred in the first section of the line section L1,
$I_{1p}$—fault loop current calculated under assumption that fault occurred in the first section of the line section L1,
$V_{T(n-1)np}$—fault loop voltage calculated under assumption that fault occurred in the line section L(2n−3),
$I_{T(n-1)np}$—fault loop current calculated under assumption that fault occurred in the line section L(2n−3),
$V_{Tkkp}$—fault loop voltage calculated under assumption that fault occurred in the $k^{th}$ tapped line,
$I_{Tkkp}$—fault loop current calculated under assumption that fault occurred in $k^{th}$ tapped line,
$V_{TkT(k+1)p}$—fault loop voltage calculated under assumption that fault occurred in the line section between two tap points,
$I_{TkT(k+1)p}$—fault loop current calculated under assumption that fault occurred in the line section between two tap points,
$I_F$—total fault current,
$Z_{1L1}$—impedance of line section L1 for the positive sequence component,
$Z_{0L1}$—impedance of line section L1 for the zero sequence component,
$Z_{1L(2n-3)}$—impedance of line section L(2n−3) for the positive sequence component, $\underline{Z}_{OL(2n-3)}$—impedance of line section L(2n−3) for the zero sequence component,
$\underline{Z}_{1L(2k-2)}$—impedance of line section L(2k−2) for the positive sequence component,
$\underline{Z}_{OL(2k-2)}$—impedance of line section L(2k−2) for the zero sequence component,
$\underline{Z}_{1L(2k-1)}$—impedance of line section L(2k−1) for the positive sequence component,
$\underline{Z}_{OL(2k-1)}$—impedance of line section L(2k−1) for the zero sequence component.
k—number of the tap point
n—number of the line terminal Preferably, for multi-terminal power lines, the fault resistance $(R_{1F})$, $(R_{(2n-3)F})$, $(R_{(2k-2)F})$, $(R_{(2k-1)F})$ is calculated from the following equations:

$$R_{1F} = \frac{1}{2}\left[\frac{\text{real}(\underline{V}_{1p}) - d_1 \text{real}(\underline{Z}_{1L1} \underline{I}_{1p})}{\text{real}(\underline{I}_F)} + \frac{\text{imag}(\underline{V}_{1p}) - d_1 \text{imag}(\underline{Z}_{1L1} \underline{I}_{1p})}{\text{imag}(\underline{I}_F)}\right],$$

$$R_{(2n-3)F} = \frac{1}{2}\left[\frac{\text{real}(\underline{V}_{T(n-1)np}) - (1 - d_{(2n-3)}) \cdot \text{real}(\underline{Z}_{1L(2n-3)} \underline{I}_{T(n-1)np})}{\text{real}(\underline{I}_F)}\right] +$$
$$\frac{1}{2}\left[\frac{\text{imag}(\underline{V}_{T(n-1)np}) - (1 - d_{(2n-3)}) \cdot \text{imag}(\underline{Z}_{1L(2n-3)} \underline{I}_{T(n-1)np})}{\text{imag}(\underline{I}_F)}\right],$$

$$R_{(2k-2)F} = \frac{1}{2}\left[\frac{\text{real}(\underline{V}_{Tkkp}) - (1 - d_{(2k-2)}) \cdot \text{real}(\underline{Z}_{1L(2k-2)} \underline{I}_{Tkkp})}{\text{real}(\underline{I}_F)}\right] +$$
$$\frac{1}{2}\left[\frac{\text{imag}(\underline{V}_{Tkkp}) - (1 - d_{(2k-2)}) \cdot \text{imag}(\underline{Z}_{1L(2k-2)} \underline{I}_{Tkkp})}{\text{imag}(\underline{I}_F)}\right]$$

$$R_{(2k-1)F} = \frac{1}{2}\left[\frac{\text{real}(\underline{V}_{TkT(k+1)p}) - (1 - d_{(2k-1)}) \cdot \text{real}(\underline{Z}_{1L(2k-1)} \underline{I}_{TkT(k+1)p})}{\text{real}(\underline{I}_F)}\right] +$$
$$\frac{1}{2}\left[\frac{\text{imag}(\underline{V}_{TkT(k+1)p}) - (1 - d_{(2k-1)}) \cdot \text{imag}(\underline{Z}_{1L(2k-1)} \underline{I}_{TkT(k+1)p})}{\text{imag}(\underline{I}_F)}\right]$$

where:
"real" denotes the real part of the given quantity,
"imag" denotes the imaginary part of the given quantity,
$d_1$—distance to fault from the beginning of the line to the fault point,
$d_{(2n-3)}$—distance to fault from the end of the line to the fault point,
$d_{(2k-2)}$—distance to fault from the end of the tapped line to the fault point
$d_{(2k-1)}$—distance to fault on the line section between two tap points,
$V_{1p}$—fault loop voltage calculated under assumption that fault occurred in the first section of the line section L1,
$I_{1p}$—fault loop current calculated under assumption that fault occurred in the first section of the line section L1,
$V_{T(n-1)np}$—fault loop voltage calculated under assumption that fault occurred in the line section L(2n−3),
$I_{T(n-1)np}$—fault loop current calculated under assumption that fault occurred in the line section L(2n−3),
$V_{Tkkp}$—fault loop voltage calculated under assumption that fault occurred in the $k^{th}$ tapped line,
$I_{Tkkp}$—fault loop current calculated under assumption that fault occurred in $k^{th}$ tapped line,
$V_{TkT(k+1)p}$—fault loop voltage calculated under assumption that fault occurred in the line section between two tap points,
$I_{TkT(k+1)p}$—fault loop current calculated under assumption that fault occurred in the line section between two tap points,
$I_F$—total fault current,
$\underline{Z}_{1L1}$—impedance of line section L1 for the positive sequence component,
$\underline{Z}_{OL1}$—impedance of line section L1 for the zero sequence component,
$\underline{Z}_{1L(2n-3)}$—impedance of line section L(2n−3) for the positive sequence component,
$\underline{Z}_{OL(2n-3)}$—impedance of line section L(2n−3) for the zero sequence component,
$\underline{Z}_{1L(2k-2)}$—impedance of line section L(2k−2) for the positive sequence component,
$\underline{Z}_{OL(2k-2)}$—impedance of line section L(2k−2) for the zero sequence component,
$\underline{Z}_{1L(2k-1)}$—impedance of line section L(2k−1) for the positive sequence component,
$\underline{Z}_{OL(2k-1)}$—impedance of line section L(2k−1) for the zero sequence component.
k—number of the tap point
n—number of the line terminal Preferably, for multi-terminal power lines, equivalent source impedance for the negative sequence component $(\underline{Z}_{2S1})$ or for the incremental positive sequence component $(\underline{Z}_{\Delta 1S1})$ is calculated assuming that the fault is located in the line section between the beginning of the line and the first tap point, according to the following equation:

$$(\underline{Z}_{iS1}) = \frac{-\underline{V}_{1i}}{\underline{I}_{1i}}$$

where
i=2 for negative sequence, i=Δ1 for incremental positive sequence component,
$V_{1i}$—voltage measured in station 1 (the first lower index) for individual symmetrical components, (the second lower index) i.e. negative component—index 2 and incremental positive sequence component—index Δ1,
$I_{1i}$—current measured in station 1 (the first lower index) for individual symmetrical components, (the second lower index) i.e. negative component—index 2 and incremental positive sequence component—index Δ1.

Preferably, for multi-terminal power lines, equivalent source impedance $((\underline{Z}_{2S(n)}))$ for the negative sequence component and $((\underline{Z}_{\Delta 1S(n)}))$ for the incremental positive sequence component is determined assuming that the fault is located in the line section between the end of the line and the last tap point, from the following equation:

$$(\underline{Z}_{iSn}) = -\frac{\underline{V}_{T(n-1)i}^{transf.} - (1 - d_{(2n-3)}) \cdot \underline{Z}_{iL(2n-3)} \cdot \underline{I}_{T(n-1)ni}^{transf.} - d_{(2n-3)} \cdot \underline{Z}_{iL(2n-3)} \cdot (\underline{I}_{T(n-1)ni}^{transf.} - \underline{I}_{Fi})}{\underline{I}_{ni}}.$$

where:
i=2 for negative sequence component, i=Δ1 for incremental positive sequence component,
$\underline{V}_{T(n-1)i}^{transf.}$—voltages in the final tap point T(n−1) for the negative sequence component i=2, or for incremental positive sequence component i=Δ1,
$d_{(2n-3)}$—distance to fault from the end of the line to the fault point,
$\underline{Z}_{iL(2n-3)}$—impedance of line section L(2n−3) for the negative sequence component i=2, or for incremental positive sequence component i=Δ1, $I_{T(n-1)ni}^{transf.}$—values of current flowing from tap point T(n−1) to station n in line section L(2n−3) for negative sequence component i=2, or for incremental positive sequence component i=Δ1

$I_{Fi}$—total fault current for negative sequence component i=2, or for incremental positive sequence component i=Δ1, $I_{ni}$—current measured in last station n (the first lower index) for individual symmetrical components, (the second lower index) i.e. negative component—index 2 and incremental positive sequence component—index Δ1.

Preferably, for multi-terminal power lines, equivalent source impedance for the negative sequence component ($(Z_{2Sk})$) and for the incremental positive sequence component ($(Z_{\Delta 1Sk})$) is determined assuming that the fault is located in the tapped line, from the following equation:

$$(Z_{iSk}) = - \frac{V_{Tki}^{transf.} - (1-d_{(2k-2)}) \cdot Z_{iL(2k-2)} \cdot I_{Tkki}^{transf.} - d_{(2k-2)} \cdot Z_{iL(2k-2)} \cdot (I_{Tkki}^{transf.} - I_{F2})}{I_{ki}}$$

where:

$V_{Tki}^{transf.}$—voltages in the $k^{th}$ tap point for, the negative sequence component i=2, or for incremental positive sequence component i=Δ1, $d_{(2k-2)}$—distance to fault from the end of the tapped line to the fault point Tk, $Z_{1L(2k-2)}$—impedance of line section L(2k−2) for the negative sequence component i=2, or for incremental positive sequence component i=Δ1, $I_{Tkki}^{transf.}$—values of current flowing from tap point Tk to $k^{th}$ station in tapped line section L(2k−2) for negative sequence component i=2, or for incremental positive sequence component i=Δ1

$I_{Fi}$—total fault current for negative sequence component i=2, or for incremental positive sequence component i=Δ1, $I_{ki}$—current measured in station k (the first lower index) for individual symmetrical components, (the second lower index) i.e. negative component—index 2 and incremental positive sequence component—index Δ1.

Preferably, for multi-terminal power lines, equivalent source impedance for the negative sequence component ($(Z_{2Sk})$ and $(Z_{2S(k+1)})$) and for the incremental positive sequence component ($(Z_{\Delta 1Sk})$ and $(Z_{\Delta 1S(k+1)})$) is calculated assuming that the fault is located in the line section between two consecutive tap points, from the following equations:

$$(Z_{iSk}) = - \frac{V_{Tki}^{transf.} - d_{(2k-1)} \cdot Z_{iL(2k-1)} \cdot I_{TkT(k+1)i}^{transf.} - (1-d_{(2k-1)}) \cdot Z_{iL(2k-1)} \cdot (I_{TkT(k+1)i}^{transf.} - I_{Fi}) + Z_{iLk} I_{ki}}{I_{ki}},$$

$$(Z_{iS(k+1)}) = - \frac{V_{Tki}^{transf.} - d_{(2k-1)} \cdot Z_{iL(2k-1)} \cdot I_{TkT(k-1)i}^{transf.} - (1-d_{(2k-1)}) \cdot Z_{iL(2k-1)} \cdot (I_{TkT(k+1)i}^{transf.} - I_{Fi}) + Z_{iL(2k)} I_{(k+1)i}}{I_{(k+1)i}}$$

where:

$V_{Tki}^{transf.}$—voltages in the $k^{th}$ tap point for the negative sequence component i=2, or for incremental positive sequence component i=Δ1, $d_{(2k-1)}$—distance to fault on the line section between two tap points $Z_{1L(2k-2)}$—impedance of line section L(2k−1) for the negative sequence component i=2, or for incremental positive sequence component i=Δ1, $I_{TkT(k+1)i}^{transf.}$—current flowing from tap point Tk to tap point T(k+1) in the line section for negative sequence component i=2, or for incremental positive sequence component i=Δ1

$I_{Fi}$—total fault current for negative sequence component i=2, or for incremental positive sequence component i=Δ1, $I_{ki}$—current measured in station k (the first lower index) for individual symmetrical components, (the second lower index) i.e. negative component—index 2 and incremental positive sequence component—index Δ1, $I_{(k+1)i}$—current measured in station k+1 (the first lower index) for individual symmetrical components, (the second lower index) i.e. negative component—index 2 and incremental positive sequence component—index Δ1

ADVANTAGES OF THE INVENTION

The advantage of the method for fault location in electric power lines which is the subject of this invention is that it makes it possible to determine the fault point for a transmission or distribution system both with passive and active tap (taps). Due to the required input signals, the inventive location method can be applied in differential-current protection, which will increase the functionality of the protective relay. In this way, the protective relay, besides its main feature, i.e. indication whether the fault occurred in the given protection zone or outside it, will be able to exactly define the location of the fault.

In addition, the inventive method is resistant to pre-fault conditions defined by the direction and volume of flow of the pre-fault power.

AN EXAMPLE OF THE INVENTION EMBODIMENT FOR A THREE-TERMINAL POWER LINE

Figure 1:
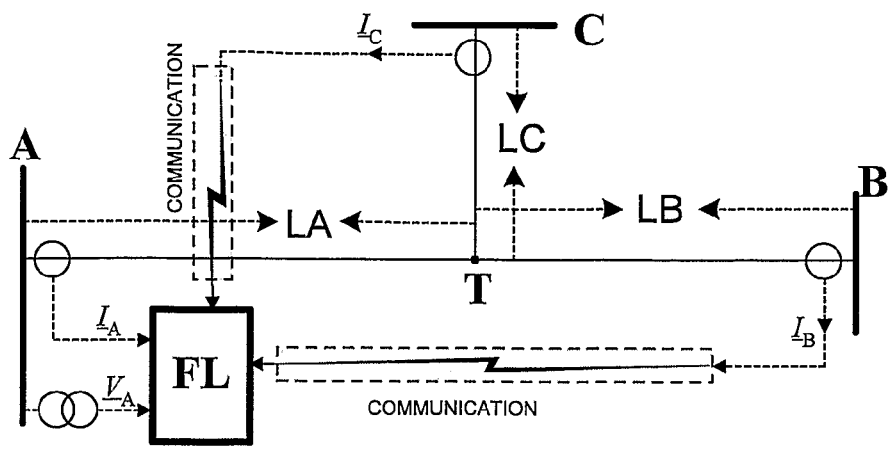
FIG. 1—shows a general diagram of the electric network for the implementation of the inventive method for a three-terminal electric power line, with indicated sections LA, LB and LC, FIG. 2—shows an equivalent circuit diagram for the positive sequence component for the assumption that the fault occurred in line section LA, FIG. 3—shows an equivalent circuit diagram of a transmission system for the negative sequence component for the assumption that the fault occurred in line section LA, FIG. 4—shows an equivalent circuit diagram of a transmission system for the zero sequence component for the assumption that the fault occurred in line section LA, FIG. 5—shows an equivalent circuit diagram for the positive sequence component for the assumption that the fault occurred in line section LB, FIG. 6—shows an equivalent circuit diagram of a transmission system for the negative sequence component for the assumption that the fault occurred in line section LB, FIG. 7—shows an equivalent circuit diagram of a transmission system for the zero sequence component for the assumption that the fault occurred in line section LB, FIG. 8—shows an equivalent circuit diagram for the positive sequence component for the assumption that the fault occurred in line section LC, FIG. 9—shows an equivalent circuit diagram of a transmission system for the negative sequence component for the assumption that the fault occurred in line section LC, FIG. 10—shows an equivalent circuit diagram of a transmission system for the zero sequence component for the assumption that the fault occurred in line section LC, FIG. 11—shows an equivalent circuit diagram of a transmission system for the negative sequence component for the assumption that the fault occurred in line section LA for calculating the impedance of equivalent systems, FIG. 12—shows an equivalent circuit diagram for the incremental positive sequence component for the assumption that the fault occurred in line section LA for calculating the impedance of equivalent systems, FIG. 13—shows the network of actions performed when locating faults on the basis of the inventive method for a three-terminal electric power line, FIG. 14—shows a general diagram of the transmission system for the implementation of the inventive method for a multi-terminal power line, FIG. 15—shows an equivalent circuit diagram of a transmission system for symmetrical components assuming that the fault is located in the first section of a multi-terminal power line, FIG. 16—shows an equivalent circuit diagram of a transmission system for symmetrical components for an assumption that the fault is located in the final section of a multi-terminal power line, FIG. 17—shows a fragment of the equivalent circuit diagram of a transmission system for symmetrical components assuming that the fault is located in a section of a tapped line of a multi-terminal power line, FIG. 18—shows a fragment of the equivalent circuit diagram of a transmission system for symmetrical components for the assumption that the fault is located in a section of a multi-terminal power line between two tap points.

The transmission system shown in FIG. 1 consists of three electric power stations A, B and C. Station A is located at the beginning of the line, station B at the end of this line and station C after the line which in tap point T is branched out from the line between stations AB. Tap point T divides the transmission system into three sections LA, LB and LC. In station A there is a fault locator FL. Fault location is done using models of faults and fault loops for symmetrical components and different types of faults, by applying suitable share coefficients determining the relation between the symmetrical components of the total fault current when voltage drop across the fault resistance is estimated, defined as $\underline{a}_{F1}$, $\underline{a}_{F2}$, $\underline{a}_{F0}$ and weight coefficients $\underline{a}_1$, $\underline{a}_2$, $\underline{a}_0$, defining the share of individual components in the total model of the fault loop. Analysis of boundary conditions for different types of faults shows that there is a certain degree of freedom when determining the share coefficients determining the relation between the symmetrical components of the total fault current when voltage drop across the fault resistance is estimated. Their selection depends on the adopted preference of the use of individual sequence components depending on the type of the fault. In the presented example of the invention embodiment, in order to ensure high precision of the fault location, voltage drop across the fault resistance is estimated using:

the negative sequence component of the total fault current for phase-to-earth faults (a-g), (b-g), (c-g) and phase-to-phase faults (a-b), (b-c) i (c-a), the negative sequence component and the zero sequence component for double phase-to-earth faults (a-b-g), (b-c-g), (c-a-g), incremental positive sequence component for three-phase faults (a-b-c, a-b-c-g), for which the fault value is decreased by the pre-fault value of the positive-sequence component of current.

Examples of share coefficients determining the relation between the symmetrical components of the total fault current when voltage drop across the fault resistance is estimated are shown in table 1. The type of the fault is denoted by symbols: a-g, b-g, c-g, a-b, b-c, c-a, where letters a, b, c denote individual phases, and letter g denotes earthing, index 1 denotes the positive-sequence component, index 2—the negative component, and index 0—the zero sequence component.

TABLE 1

| Fault (F) | $a_{F1}$ | $a_{F2}$ | $a_{F0}$ |
|---|---|---|---|
| a-g | 0 | 3 | 0 |
| b-g | 0 | 3a | 0 |
| c-g | 0 | $3a^2$ | 0 |
| a-b | 0 | $1 - a$ | 0 |
| b-c | 0 | $a - a^2$ | 0 |
| c-a | 0 | $a^2 - 1$ | 0 |

$a = \exp(j2\pi/3); j = \sqrt{-1}$

Synchronised measurements of phase currents from stations A, B, C and of phase voltages from station A are supplied to the fault locator FL. Additionally, it is assumed that the fault locator is supplied with information about the type of the fault and the time of its occurrence. The process of fault location, assuming that it is a fault of the type (a-b-g)—double phase-to-earth fault, is as follows:

I. Stage One

1. In stations A, B, C, current input signals from individual lines for fault and pre-fault conditions are measured. In station A, phase voltages of the line in fault and pre-fault conditions are measured. Next, the symmetrical components of the phase currents measured in stations A, B, C and of phase voltages measured in station A are calculated.

2. Total fault current ($\underline{I}_F$) is calculated from this equation:

$$\underline{I}_F = \underline{a}_{F1}\underline{I}_{F1} + \underline{a}_{F2}\underline{I}_{F2} + \underline{a}_{F0}\underline{I}_{F0} \quad (1)$$

where:
the first lower index "F" denotes a fault condition, the second lower index "1" denotes the positive sequence component, "2"—the negative component, "0"—zero sequence component,
and the share coefficients determining the relation between the symmetrical components of the total fault current when voltage drop across the fault resistance is estimated are as follows:

$$\underline{a}_{F1} = 0,$$

$$\underline{a}_{F2} = \underline{a}_{F2}^{init.} - \frac{\underline{a}_{F1}^{init.} \cdot \underline{b}_{F2}}{\underline{b}_{F1}},$$

$$\underline{a}_{F0} = \frac{\underline{a}_{F1}^{init}}{\underline{b}_{F1}},$$

whereas, in particular for a-b-g fault:

$$\underline{a}_{F1}^{init.} = 1 - \underline{a}^2,$$
$$\underline{a}_{F2}^{init.} = 1 - \underline{a},$$
$$\underline{b}_{F1} = -\underline{a},$$
$$\underline{b}_{F2} = -\underline{a}^2,$$
$$\underline{a} = \exp^{j2\pi/3} = -0,5 + j\frac{\sqrt{3}}{2},$$

$$\underline{I}_{F1} = \underline{I}_{A1} + \underline{I}_{B1} + \underline{I}_{C1}, \quad (2)$$

$$\underline{I}_{F2} = \underline{I}_{A2} + \underline{I}_{B2} + \underline{I}_{C2}, \quad (3)$$

$$\underline{I}_{F0} = \underline{I}_{A0} + \underline{I}_{B0} + \underline{I}_{C0}, \quad (4)$$

where: the first lower index denotes the station, the second lower index denotes: 1—the positive sequence component, 2—the negative component, 0—the zero sequence component.

For faults of other types, the share coefficients determining the relation between the symmetrical components of the total fault current when voltage drop across the fault resistance is estimated and "relation coefficients" are compiled in tables 1, 2 and 3.

TABLE 2

| | Initial share coefficient determining the relation between the symmetrical components of the total fault current when voltage drop across the fault resistance is estimated | | | Relation coefficient | |
|---|---|---|---|---|---|
| Fault (F) | $a_{F1}^{init.}$ | $a_{F2}^{init.}$ | $a_{F0}^{init.}$ | $b_{F1}$ | $b_{F2}$ |
| a-b-g | $1 - a^2$ | $1 - a$ | 0 | $-a$ | $-a^2$ |
| b-c-g | $a^2 - a$ | $a - a^2$ | 0 | $-1$ | $-1$ |
| c-a-g | $a - 1$ | $a^2 - 1$ | 0 | $-a^2$ | $-a$ |

TABLE 3

| | share coefficient determining the relation between the symmetrical components of the total fault current when voltage drop across the fault resistance is estimated | | |
|---|---|---|---|
| Fault (F) | $a_{F1}$ | $a_{F2})^*$ | $a_{F0}$ |
| a-b-c, a-b-c-g | $1 - a^2$ | $1 - a$ | 0 |

)* due to the lack of the negative component this coefficient may be adopted as = 0

II. Stage Two

In stage two, a hypothetical fault point is assumed and the distance between the end of the given line section and the hypothetical fault point is calculated on the following assumptions:

calculation of the distance from the beginning of the line to the fault point assuming that the fault occurred in line section LA—actions 3.1.a-3.2.a, calculation of the distance from the end of the line to the fault point assuming that the fault occurred in line section LB—actions 3.1.b-3.4.b, calculation of the distance from the end of the tapped line to the fault point assuming that the fault occurred in line section LC—actions 3.1.c-3.3.c.

Figure 2:
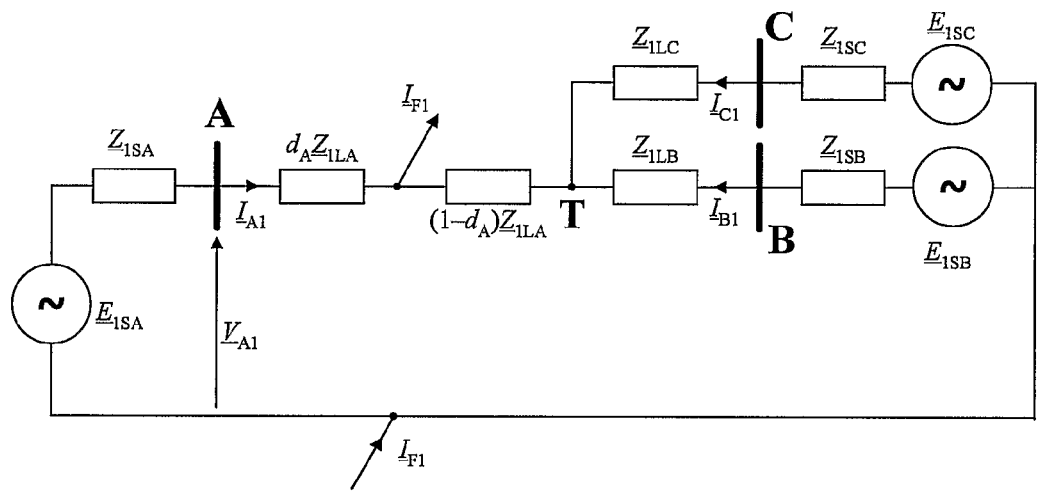
Figure 3:
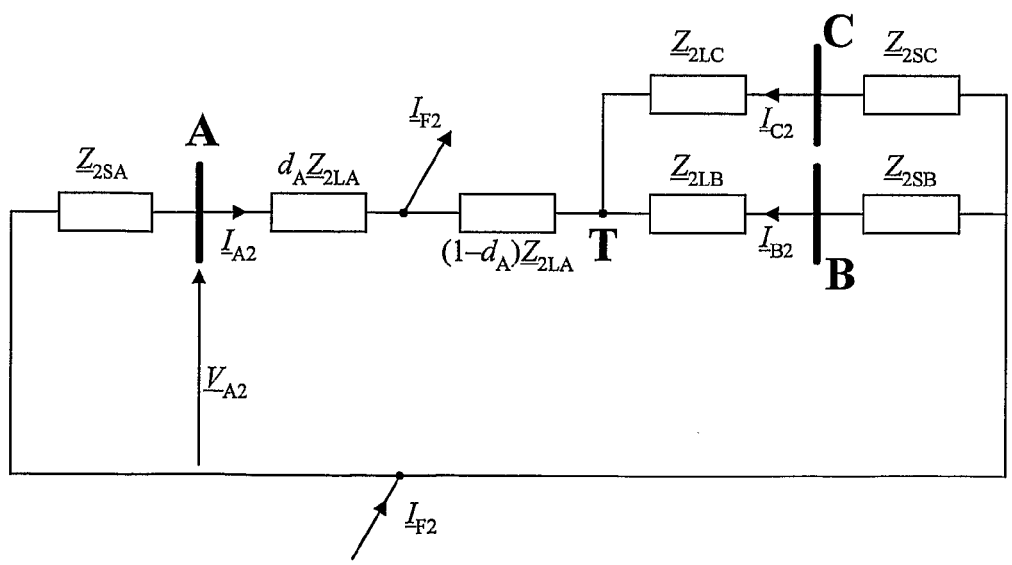
Figure 4:
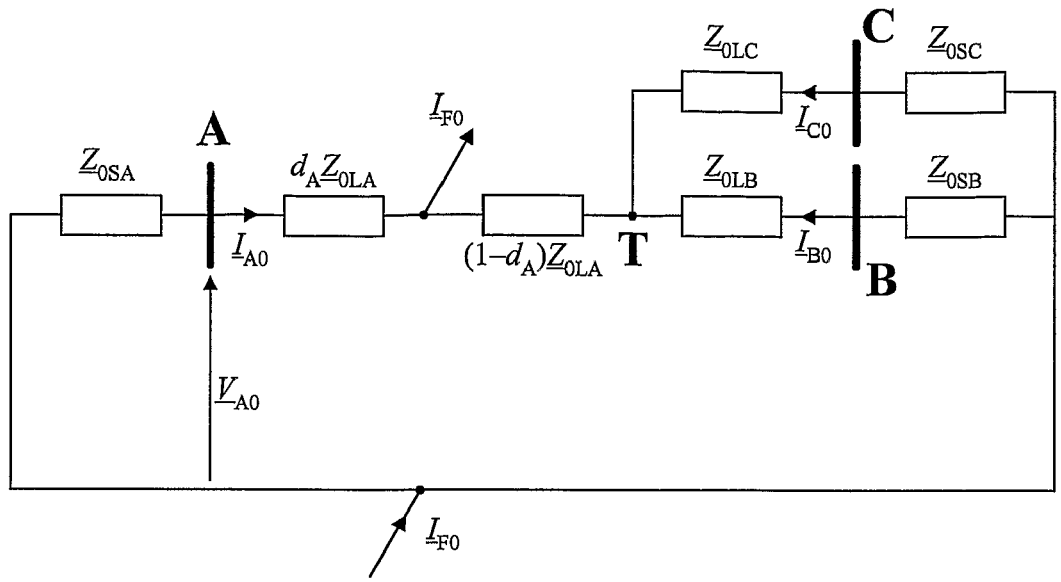

3.1.a. The fault loop voltage and current is determined from the following relations between symmetrical components (FIG. 2-4):

$$\underline{V}_{Ap} = \underline{a}_1 \underline{V}_{A1} + \underline{a}_2 \underline{V}_{A2} + \underline{a}_0 \underline{V}_{A0} \quad (5)$$

$$\underline{I}_{Ap} = \underline{a}_1 \underline{I}_{A1} + \underline{a}_2 \underline{I}_{A2} + \underline{a}_0 \frac{\underline{Z}_{0LA}}{\underline{Z}_{1LA}} \underline{I}_{A0}, \quad (6)$$

where:

$\underline{V}_{A1}, \underline{V}_{A2}, \underline{V}_{A0}$—voltage measured in station A for individual symmetrical components, the positive sequence component—index 1, the negative component—index 2 and the zero sequence component—index 0.

$\underline{I}_{A1}, \underline{I}_{A2}, \underline{I}_{A0}$—currents measured in station A for the positive sequence component—index 1, the negative component—index 2 and the zero sequence component—index 0, $\underline{Z}_{1LA}$—the impedance of line section LA for the positive sequence component, $\underline{Z}_{0LA}$—the impedance of line section LA for the zero sequence component, In particular for a-b-g fault, the weight coefficients are:

$\underline{a}_1 = 1 - \underline{a}^2$, $\underline{a}_2 = 1 - \underline{a}$, $\underline{a}_0 = 0$.

Weight coefficients for other types of faults are compiled in table 4.

TABLE 4

| Fault | $a_1$ | $a_2$ | $a_0$ |
|---|---|---|---|
| a-g | 1 | 1 | 1 |
| b-g | $a^2$ | $a$ | 1 |
| c-g | $a$ | $a^2$ | 1 |
| a-b, a-b-g | $1 - a^2$ | $1 - a$ | 0 |
| a-b-c, a-b-c-g | | | |
| b-c, b-c-g | $a^2 - a$ | $a - a^2$ | 0 |
| c-a, c-a-g | $a - 1$ | $a^2 - 1$ | 0 |

Fault loop equation has the following form:

$$\underline{V}_{Ap} - d_A \underline{Z}_{1LA} \underline{I}_{Ap} - R_{FA} \underline{I}_F = 0 \quad (7).$$

When the equation (7) has been written out separately for the real part and the imaginary part and further mathematical transformations have been performed, the solutions shown under 3.2a are obtained.

3.2a. The distance to the fault point $d_A$ and the fault resistance $R_{FA}$ are determined from the following equations:

$$d_A = \frac{\text{real}(\underline{V}_{Ap})\text{imag}(\underline{I}_F) - \text{imag}(\underline{V}_{Ap})\text{real}(\underline{I}_F)}{\text{real}(\underline{Z}_{1LA}\underline{I}_{Ap})\text{imag}(\underline{I}_F) - \text{imag}(\underline{Z}_{1LA}\underline{I}_{Ap})\text{real}(\underline{I}_F)}, \quad (8)$$

$$R_{FA} = \quad (9)$$
$$\frac{1}{2}\left[\frac{\text{real}(\underline{V}_{Ap}) - d_A\text{real}(\underline{Z}_{1LA}\underline{I}_{Ap})}{\text{real}(\underline{I}_F)} + \frac{\text{imag}(\underline{V}_{Ap}) - d_A\text{imag}(\underline{Z}_{1LA}\underline{I}_{Ap})}{\text{imag}(\underline{I}_F)}\right],$$

where:

"real" denotes the real part of the given quantity,

"imag" denotes the imaginary part of the given quantity, $\underline{V}_{Ap}$—denotes the voltage of the fault loop as per the formula (5)

$\underline{I}_F$—denotes the total fault current as per the formula (1), $\underline{Z}_{1LA}$—denotes the impedance of the line section LA for the positive sequence component, $\underline{I}_{Ap}$—denotes the fault loop current determined as per the formula (6).

3.1.b. Voltages for symmetrical components are calculated $\underline{V}_{T1}^{transf.}$, $\underline{V}_{T2}^{transf.}$, $\underline{V}_{T0}^{transf.}$ (FIG. 5-7) in tap point T:

$$\underline{V}_{T1}^{transf.} = \cos h(\underline{\gamma}_{1LA}l_{LA}) \cdot \underline{V}_{A1} - \underline{Z}_{c1LA} \sin h(\underline{\gamma}_{1LA}l_{LA}) \cdot \underline{I}_{A1},$$

$$\underline{V}_{T2}^{transf.} = \cos h(\underline{\gamma}_{1LA}l_{LA}) \cdot \underline{V}_{A2} - \underline{Z}_{c1LA} \sin h(\underline{\gamma}_{1LA}l_{LA}) \cdot \underline{I}_{A2},$$

$$\underline{V}_{T0}^{transf.} = \cos h(\underline{\gamma}_{0LA}l_{LA}) \cdot \underline{V}_{A0} - \underline{Z}_{c0LA} \sin h(\underline{\gamma}_{0LA}l_{LA}) \cdot \underline{I}_{A0},$$

where:

$\gamma_{1LA}$—propagation constant of line section LA for the positive and negative sequence components, $\gamma_{0LA}$—propagation constant of line section LA for the zero sequence component, $l_{LA}$—length of line section LA, $\underline{Z}_{c1LA}$—surge impedance of section LA for the positive and negative sequence components, $\underline{Z}_{c0LA}$—surge impedance of section LA for the zero sequence component.

Figure 5:
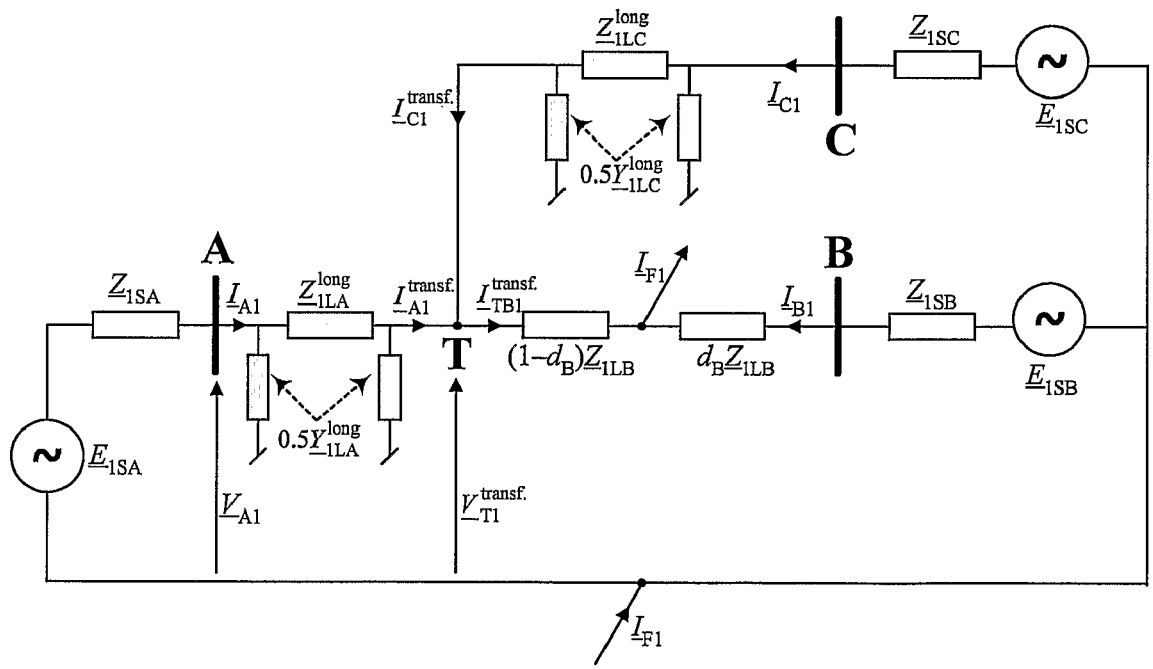
Figure 6:
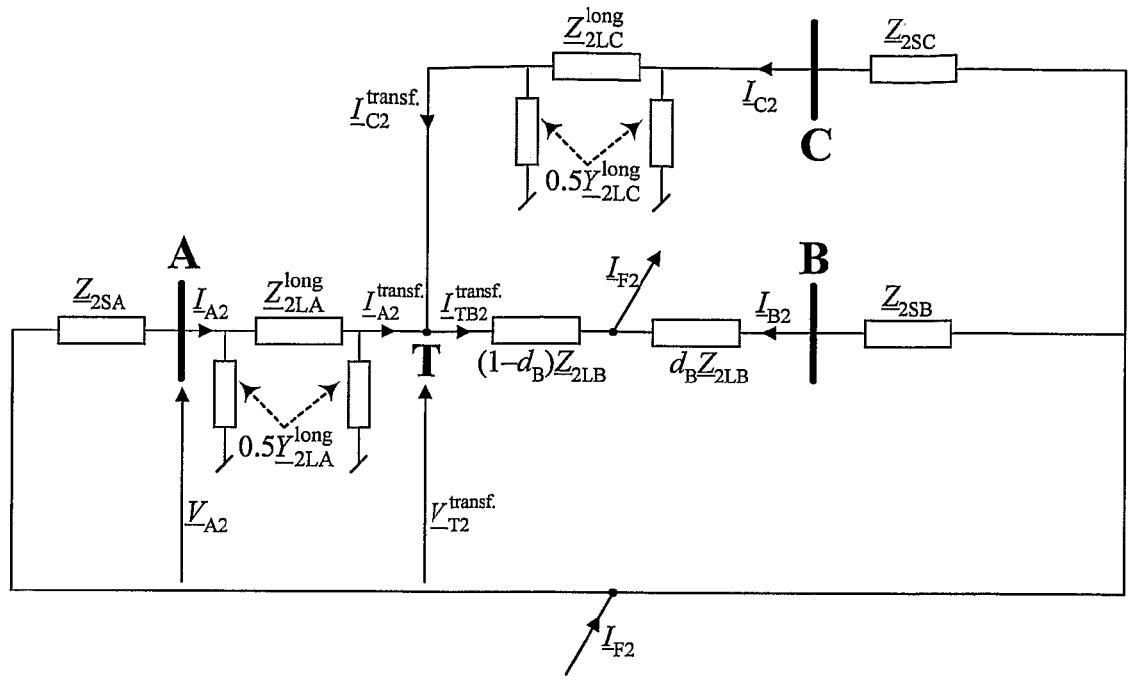
Figure 7:
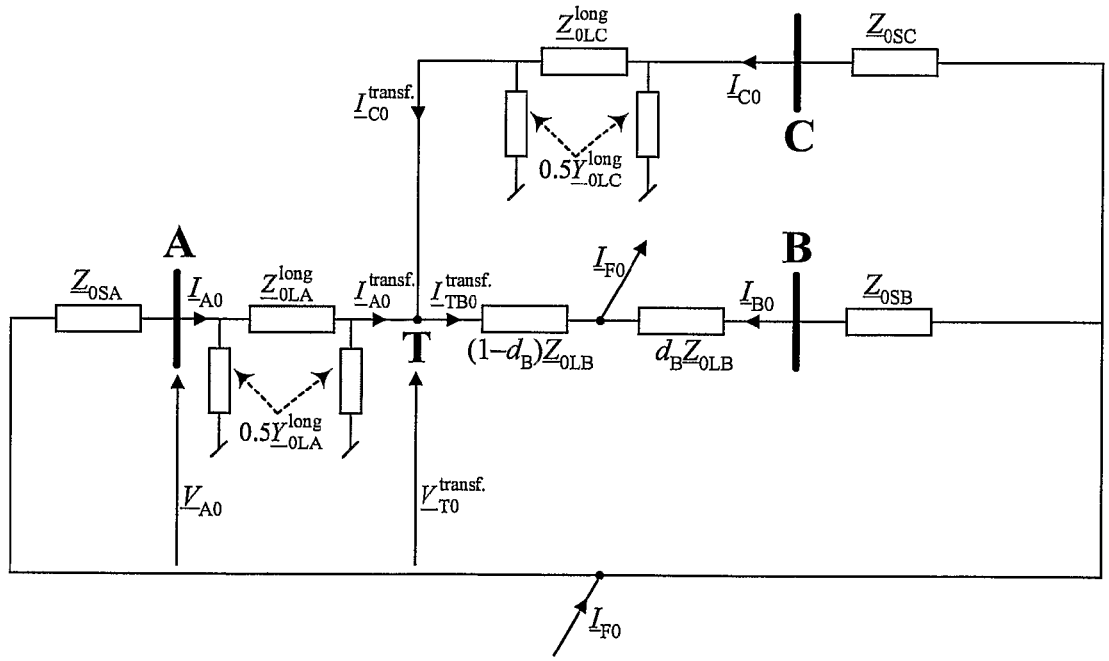

3.2.b. The values of currents incoming to tap point T from line section LA: $\underline{I}_{A1}^{transf.}$, $\underline{I}_{A2}^{transf.}$, $\underline{I}_{A0}^{transf.}$ and section LC: $\underline{I}_{C1}^{transf.}$, $\underline{I}_{C2}^{transf.}$, $\underline{I}_{C0}^{transf.}$ (FIG. 5-7)

$$\underline{I}_{A1}^{transf.} = (-1/\underline{Z}_{c1LA}) \cdot \sin h(\underline{\gamma}_{1LA}l_{LA}) \cdot \underline{V}_{A1} + \cos h(\underline{\gamma}_{1LA}l_{LA}) \cdot \underline{I}_{A1},$$

$$\underline{I}_{A2}^{transf.} = (-1/\underline{Z}_{c1LA}) \cdot \sin h(\underline{\gamma}_{1LA}l_{LA}) \cdot \underline{V}_{A2} + \cos h(\underline{\gamma}_{1LA}l_{LA}) \cdot \underline{I}_{A2},$$

$$\underline{I}_{A0}^{transf.} = (-1/\underline{Z}_{c0LA}) \cdot \sin h(\underline{\gamma}_{0LA}l_{LA}) \cdot \underline{V}_{A0} + \cos h(\underline{\gamma}_{0LA}l_{LA}) \cdot \underline{I}_{A0},$$

$$\underline{I}_{C1}^{transf.} = (-1/\underline{Z}_{c1LC}) \cdot \tan h(\underline{\gamma}_{1LC}l_{LC}) \cdot \underline{V}_{T1}^{transf.} + (1/\cos h(\underline{\gamma}_{1LC}l_{LC})) \cdot \underline{I}_{C1},$$

$$\underline{I}_{C2}^{transf.} = (-1/\underline{Z}_{c1LC}) \cdot \tan h(\underline{\gamma}_{1LC}l_{LC}) \cdot \underline{V}_{T2}^{transf.} + (1/\cos h(\underline{\gamma}_{1LC}l_{LC})) \cdot \underline{I}_{C2},$$

$$\underline{I}_{C0}^{transf.} = (-1/\underline{Z}_{c0LC}) \cdot \tan h(\underline{\gamma}_{0LC}l_{LC}) \cdot \underline{V}_{T0}^{transf.} + (1/\cos h(\underline{\gamma}_{0LC}l_{LC})) \cdot \underline{I}_{C0},$$

where:

$\gamma_{1LC}$—propagation constant of line section LC for the positive and negative sequence components, $\gamma_{0LC}$—propagation constant of line section LC for the zero sequence component, $\underline{Z}_{c1LC}$—surge impedance of section LC for the positive and negative sequence components, $\underline{Z}_{c0LC}$—surge impedance of section LC for the zero sequence component, $l_{LC}$—length of line section LC.

3.3.b. The values of current $\underline{I}_{TB1}^{transf.}$, $\underline{I}_{TB2}^{transf.}$, $\underline{I}_{TB0}^{transf.}$ flowing from tap point T to station B in line section LB is calculated:

$$\underline{I}_{TB1}^{transf.} = \underline{I}_{A1}^{transf.} + \underline{I}_{C1}^{transf.},$$

$$\underline{I}_{TB2}^{transf.} = \underline{I}_{A2}^{transf.} + \underline{I}_{C2}^{transf.},$$

$$\underline{I}_{TB0}^{transf.} = \underline{I}_{A0}^{transf.} + \underline{I}_{C0}^{transf.}.$$

Fault loop equation has the following form:

$$\underline{V}_{Tp} - (1 - d_B)\underline{Z}_{1LB}\underline{I}_{TBp} - R_{FB}\underline{I}_F = 0 \quad (10),$$

where:

$$\underline{V}_{Tp} = \underline{a}_1 \underline{V}_{T1}^{transf.} + \underline{a}_2 \underline{V}_{T2}^{transf.} + \underline{a}_0 \underline{V}_{T0}^{transf.}$$

$$\underline{I}_{TBp} = \underline{a}_1 \underline{I}_{TB1}^{transf.} + \underline{a}_2 \underline{I}_{TB2}^{transf.} + \underline{a}_0 \underline{Z}_{0LB}/\underline{Z}_{1LB}\underline{I}_{TB0}^{transf.} \quad (11)$$

When the equation (10) has been written out separately for the real part and the imaginary part and further mathematical transformations have been performed, the solutions shown under 3.4b are obtained.

3.4.b. The distance to fault point $d_B$ and fault resistance $R_{FB}$ are calculated from the following equations:

$$d_B = \frac{-\text{real}(\underline{V}_{Tp} - \underline{Z}_{1LB}\underline{I}_{TBp})\text{imag}(\underline{I}_F) +}{\text{real}(\underline{Z}_{1LB}\underline{I}_{TBp})\text{imag}(\underline{I}_F) - \text{imag}(\underline{Z}_{1LB}\underline{I}_{TBp})\text{real}(\underline{I}_F)}, \quad (12)$$

$$R_{FB} = \frac{1}{2}\left[\frac{\text{real}(\underline{V}_{Tp}) - (1 - d_B) \cdot \text{real}(\underline{Z}_{1LB}\underline{I}_{TBp})}{\text{real}(\underline{I}_F)}\right] + \quad (13)$$

$$\frac{1}{2}\left[\frac{\text{imag}(\underline{V}_{Tp}) - (1 - d_B) \cdot \text{imag}(\underline{Z}_{1LB}\underline{I}_{TBp})}{\text{imag}(\underline{I}_F)}\right],$$

where:

$\underline{Z}_{1LB}$—impedance of line section LB for the positive sequence component, $\underline{Z}_{0LB}$—impedance of line section LB for the zero sequence component.

Figure 8:
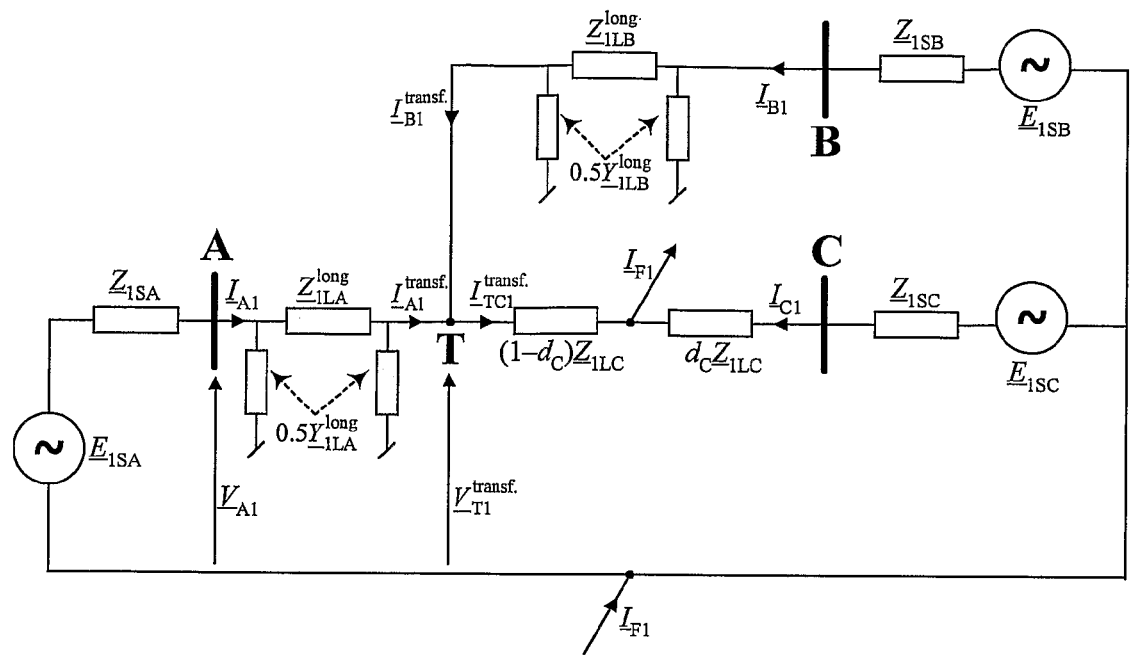
Figure 9:
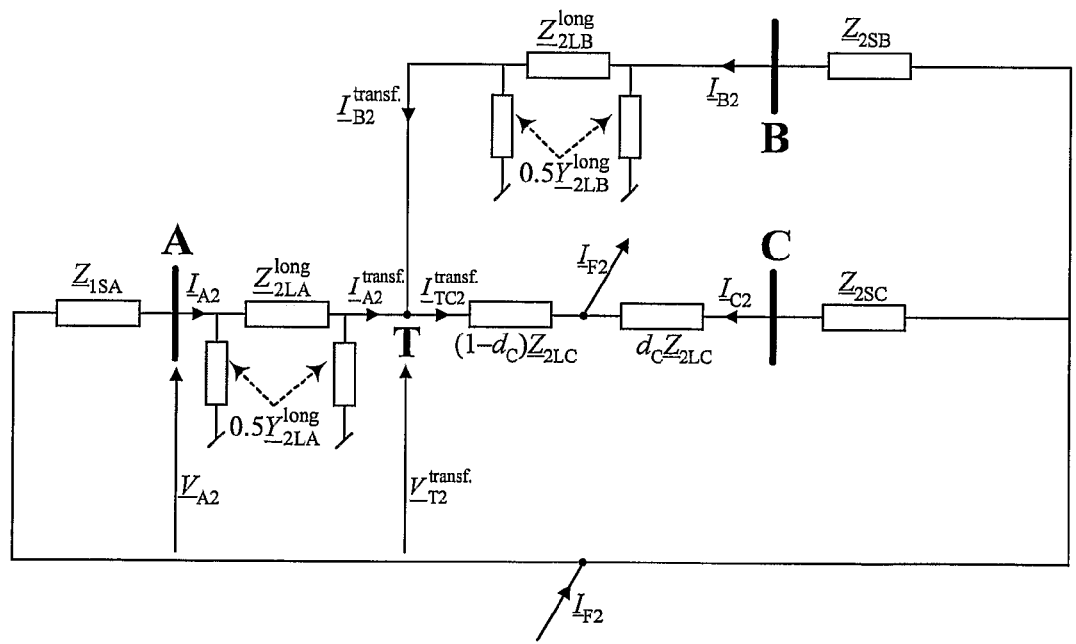
Figure 10:
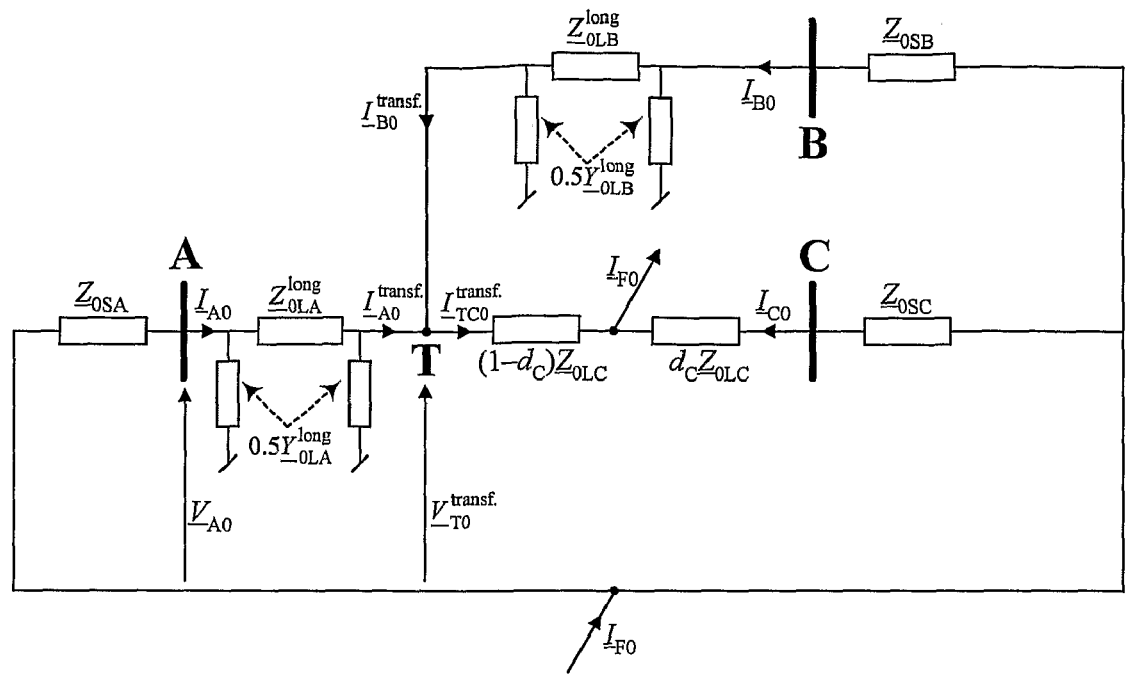

3.1.c. The values of currents incoming to tap point T (FIG. 8-10) from line sections LA $\underline{I}_{A1}^{transf.}$, $\underline{I}_{A2}^{transf.}$, $\underline{I}_{A0}^{transf.}$ and section LB $\underline{I}_{B1}^{transf.}$, $\underline{I}_{B2}^{transf.}$, $\underline{I}_{B0}^{transf.}$ are calculated according to these formulas:

$$\underline{I}_{B1}^{transf.} = (-1/\underline{Z}_{c1LB}) \cdot \tan h(\underline{\gamma}_{1LB}l_{LB}) \cdot \underline{V}_{T1}^{transf.} + (1/\cos h(\underline{\gamma}_{1LB}l_{LB})) \cdot \underline{I}_{B1},$$

$$\underline{I}_{B2}^{transf.} = (-1/\underline{Z}_{c1LB}) \cdot \tan h(\underline{\gamma}_{1LB}l_{LB}) \cdot \underline{V}_{T2}^{transf.} + (1/\cos h(\underline{\gamma}_{1LB}l_{LB})) \cdot \underline{I}_{B2},$$

$$\underline{I}_{B0}^{transf.} = (-1/\underline{Z}_{c0LB}) \cdot \tan h(\underline{\gamma}_{0LB}l_{LB}) \cdot \underline{V}_{T0}^{transf.} + (1/\cos h(\underline{\gamma}_{0LB}l_{LB})) \cdot \underline{I}_{B0},$$

$$\underline{I}_{A1}^{transf.} = (-1/\underline{Z}_{c1LA}) \cdot \sin h(\underline{\gamma}_{1LA}l_{LA}) \cdot \underline{V}_{A1} + \cos h(\underline{\gamma}_{1LA}l_{LA}) \cdot \underline{I}_{A1},$$

$$\underline{I}_{A2}^{transf.} = (-1/\underline{Z}_{c1LA}) \cdot \sin h(\underline{\gamma}_{1LA}l_{LA}) \cdot \underline{V}_{A2} + \cos h(\underline{\gamma}_{1LA}l_{LA}) \cdot \underline{I}_{A2},$$

$$\underline{I}_{A0}^{transf.} = (-1/\underline{Z}_{c0LA}) \cdot \sin h(\underline{\gamma}_{0LA}l_{LA}) \cdot \underline{V}_{A0} + \cos h(\underline{\gamma}_{0LA}l_{LA}) \cdot \underline{I}_{A0},$$

where:

$\gamma_{1LB}$—propagation constant of line section LB for the positive and negative sequence components, $\gamma_{0LB}$—propagation constant of line section LB for the zero sequence component, $l_{LB}$—the length of line section LB.

$\underline{Z}_{c1LB}$—surge impedance of section LB for the positive sequence and negative components, $\underline{Z}_{c0LB}$—surge impedance of section LB for the zero sequence component.

3.2.c. The value of current $\underline{I}_{TC1}^{transf.}$, $\underline{I}_{TC2}^{transf.}$, $\underline{I}_{TC0}^{transf.}$ flowing from tap point T to station C in line section LC (FIG. 8-10) is calculated:

$$\underline{I}_{TC1}^{transf.} = \underline{I}_{A1}^{transf.} + \underline{I}_{B1}^{transf.},$$

$$\underline{I}_{TC2}^{transf.} = \underline{I}_{A2}^{transf.} + \underline{I}_{B2}^{transf.},$$

$$\underline{I}_{TC0}^{transf.} = \underline{I}_{A0}^{transf.} + \underline{I}_{B0}^{transf.}.$$

Fault loop equation has the following form:

$$\underline{V}_{Tp} - (1 - d_C)\underline{Z}_{1LC}\underline{I}_{TCp} - R_{FC}\underline{I}_F = 0 \quad (14)$$

where:

$$\underline{V}_{Tp} = \underline{a}_1 \underline{V}_{T1}^{transf.} + \underline{a}_2 \underline{V}_{T2}^{transf.} + \underline{a}_0 \underline{V}_{T0}^{transf.} \quad (15)$$

$$\underline{I}_{TCp} = \underline{a}_1 \underline{I}_{TC1}^{transf.} + \underline{a}_2 \underline{I}_{TC2}^{transf.} + \underline{a}_0 \frac{\underline{Z}_{0LC}}{\underline{Z}_{1LC}} \underline{I}_{TC0}^{transf.}$$

When the equation (13) has been written out separately for the real part and the imaginary part and further mathematical transformations have been performed, the solutions shown under 3.3.c are obtained.

3.3.c. The distance to fault point $d_C$ and fault resistance $R_{FC}$ are calculated from the following equations:

$$d_C = \frac{-\text{real}(\underline{V}_{Tp} - \underline{Z}_{1LC}\underline{I}_{TCp})\text{imag}(\underline{I}_F) + \text{imag}(\underline{V}_{Tp} - \underline{Z}_{1LC}\underline{I}_{TCp})\text{real}(\underline{I}_F)}{\text{real}(\underline{Z}_{1LC}\underline{I}_{TCp})\text{imag}(\underline{I}_F) - \text{imag}(\underline{Z}_{1LC}\underline{I}_{TCp})\text{real}(\underline{I}_F)}, \quad (16)$$

$$R_{FC} = \frac{1}{2}\left[\frac{\text{real}(\underline{V}_{Tp}) - (1 - d_C)\cdot\text{real}(\underline{Z}_{1LC}\underline{I}_{TCp})}{\text{real}(\underline{I}_F)}\right] + \frac{1}{2}\left[\frac{\text{imag}(\underline{V}_{Tp}) - (1 - d_C)\cdot\text{imag}(\underline{Z}_{1LC}\underline{I}_{TCp})}{\text{imag}(\underline{I}_F)}\right]. \quad (17)$$

III. Stage Three

At this stage the selection of final results is done.

4. It is checked whether the results of the calculation of the distances $d_A$, $d_B$, $d_C$ to the fault point are contained within the interval $(0 \div 1)$ in relative units:

$0 \leq d_A \leq 1$, $0 \leq d_B \leq 1$, $0 \leq d_C \leq 1$.

Results which are not contained in the given interval show that they have been calculated on a false pre-assumption concerning the point of occurrence of the fault on the given line section. These results are rejected.

5. The second calculated value, i.e. fault resistance $R_{FA}$, $R_{FB}$, $R_{FC}$ is analysed and those results of the calculations for which the fault resistance is negative are rejected.

6. If the analysis of the criteria as in actions 4 and 5 does not indicate clearly which values define the place of the fault, then in subsequent actions the impedance of equivalent source systems for the negative component in the case of phase-to-earth, phase-to-phase, double phase-to earth faults, or alternatively for the incremental positive sequence component is calculated. For three-phase faults, the impedance of equivalent source systems for the incremental positive sequence component is calculated.

Figure 11:
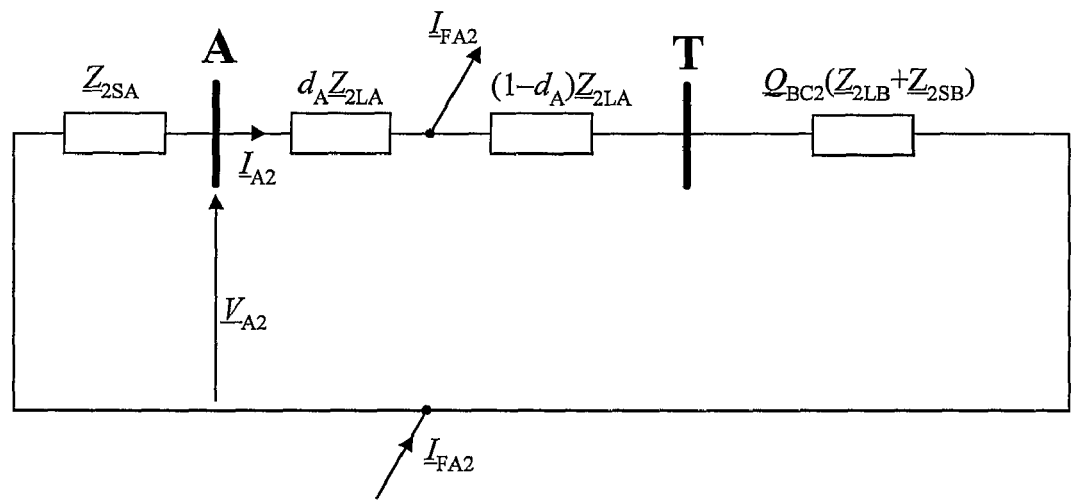
Figure 12:
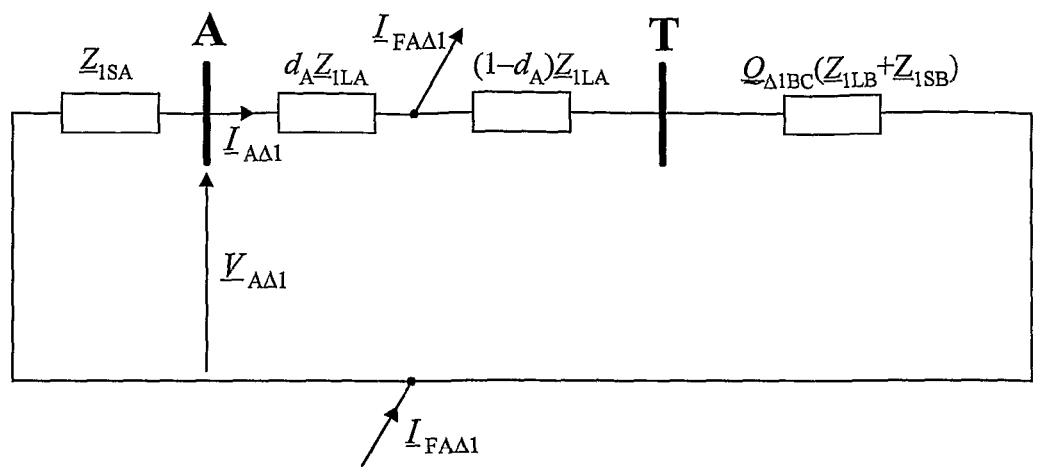

7. Current $\underline{I}_{FA2}$ (FIG. 11) is calculated assuming that the fault occurred in line section LA:

$$\underline{I}_{FA2} = \frac{\underline{Z}_{2SA} + \underline{Z}_{2LA} + \underline{Q}_{BC2}(\underline{Z}_{2LB} + \underline{Z}_{2SB})}{(1 - d_A)\underline{Z}_{2LA} + \underline{Q}_{BC2}(\underline{Z}_{2LB} + \underline{Z}_{2SB})}\underline{I}_{A2},$$

where:

$$\underline{Q}_{BC2} = \frac{\underline{I}_{B2}}{\underline{I}_{B2} + \underline{I}_{C2}},$$

8. The equivalent source impedance $(\underline{Z}_{2SB})_{SUB\_A}$ is calculated assuming that the fault occurred in line section LA:

$$(\underline{Z}_{2SB})_{SUB\_A} = \frac{\underline{G}_{2A}\underline{I}_{A2} - \underline{H}_{2A}\underline{I}_{FA2}}{\underline{Q}_{BC2}(\underline{I}_{FA2} - \underline{I}_{A2})}, \quad (18)$$

where:

$\underline{G}_{2A} = \underline{Z}_{2SA} + \underline{Z}_{2LA} + \underline{Q}_{BC2}\underline{Z}_{2LB}$, $\underline{H}_{2A} = (1 - d_A)\underline{Z}_{2LA} + \underline{Q}_{BC2}\underline{Z}_{2LB}$, $\underline{Z}_{2SA} = \dfrac{-\underline{V}_{A2}}{\underline{I}_{A2}}$.

9. The equivalent source impedance $(\underline{Z}_{2SC})_{SUB\_A}$ is calculated assuming that the fault occurred in line section LA:

$$(\underline{Z}_{2SC})_{SUB\_A} = (\underline{Z}_{2LB} + (\underline{Z}_{2SB})_{SUB\_A})\frac{\underline{I}_{B2}}{\underline{I}_{C2}} - \underline{Z}_{2LC}. \quad (19)$$

10. The equivalent source impedance $(\underline{Z}_{2SB})_{SUB\_B}$ is calculated assuming that the fault occurred in line section LB:

$$(\underline{Z}_{2SB})_{SUB\_B} = \frac{(1 - d_B)\underline{Z}_{2LB}\underline{I}_{TB2}^{transf.} - d_B\underline{Z}_{2LB}\underline{I}_{B2} - \underline{V}_{T2}^{transf.}}{\underline{I}_{B2}}. \quad (20)$$

11. The equivalent source impedance $(\underline{Z}_{2SC})_{SUB\_B}$ is calculated assuming that the fault occurred in line section LB:

$$(\underline{Z}_{2SC})_{SUB\_B} = -\frac{\underline{V}_{C2}}{\underline{I}_{C2}}. \quad (21)$$

where:

$\underline{V}_{C2} = \cosh(\underline{\gamma}_{2LC}l_{LC})\cdot\underline{V}_{T2}^{transf.} + \underline{Z}_{c2LC}\sinh(\underline{\gamma}_{2LC}l_{LC})\cdot\underline{I}_{C2}^{transf.}$, $\underline{\gamma}_{2LC} = \underline{\gamma}_{1LC}$, $\underline{Z}_{c2LC} = \underline{Z}_{c1LC}$.

12. The equivalent source impedance $(\underline{Z}_{2SB})_{SUB\_C}$ is calculated assuming that the fault occurred in line section LC:

$$(\underline{Z}_{2SC})_{SUB\_C} = \frac{(1 - d_C)\underline{Z}_{2LC}\underline{I}_{TC2}^{transf.} - d_C\underline{Z}_{2LC}\underline{I}_{C2} - \underline{V}_{T2}^{transf.}}{\underline{I}_{C2}}. \quad (22)$$

13. The equivalent source impedance $(\underline{Z}_{2SB})_{SUB\_C}$ is calculated assuming that the fault occurred in line section LC:

$$(\underline{Z}_{2SB})_{SUB\_C} = -\frac{\underline{V}_{B2}}{\underline{I}_{B2}}. \quad (23)$$

where:

$\underline{V}_{B2} = \cosh(\underline{\gamma}_{2LB}l_{LB})\cdot\underline{V}_{T2}^{transf.} + \underline{Z}_{c2LB}\sinh(\underline{\gamma}_{2LB}l_{LB})\cdot\underline{I}_{B2}^{transf.}$, 14. The calculated equivalent source impedances are transformed into a modular form, whereupon the proper result is selected on the basis of the module of the equivalent source system impedances.

If the calculated value of the module of the equivalent source system impedances, assuming the occurrence of the fault on the given line section, does not correspond to the real value of the source system impedance module, it means that the preliminary data concerning the place of occurrence of the fault on the given section have been assumed wrongly, and the result of the calculation of the distance to the fault point made on this assumption is rejected.

If the value of the module of impedance of the equivalent source systems calculated on the assumption that the fault occurred in the given line section corresponds to the real value of the module of impedance of the equivalent source system, then the result of the calculation of the distance to the fault point indicates a correct pre-assumption and this result is considered to be final.

Figure 13:
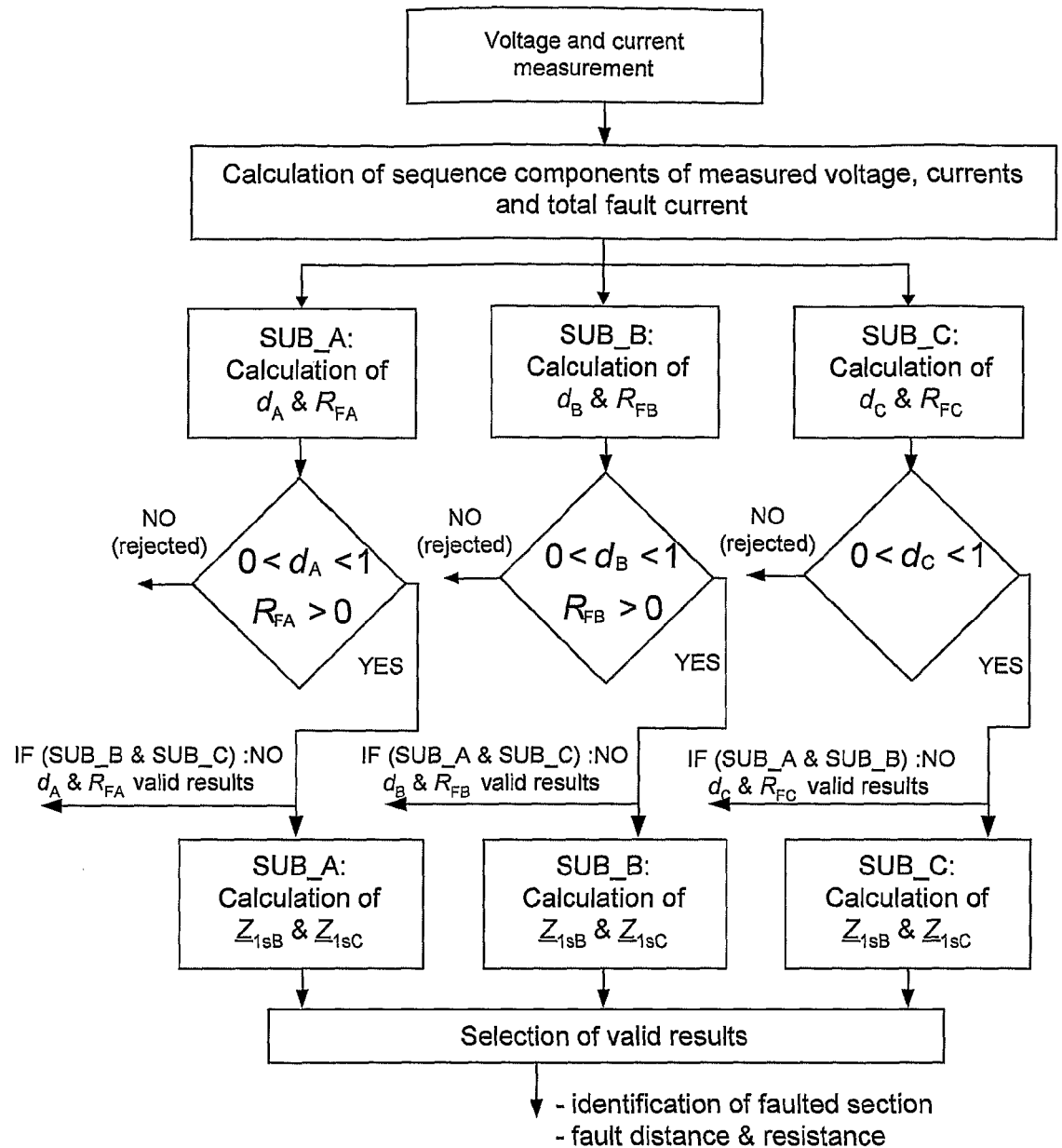
Figure 16:
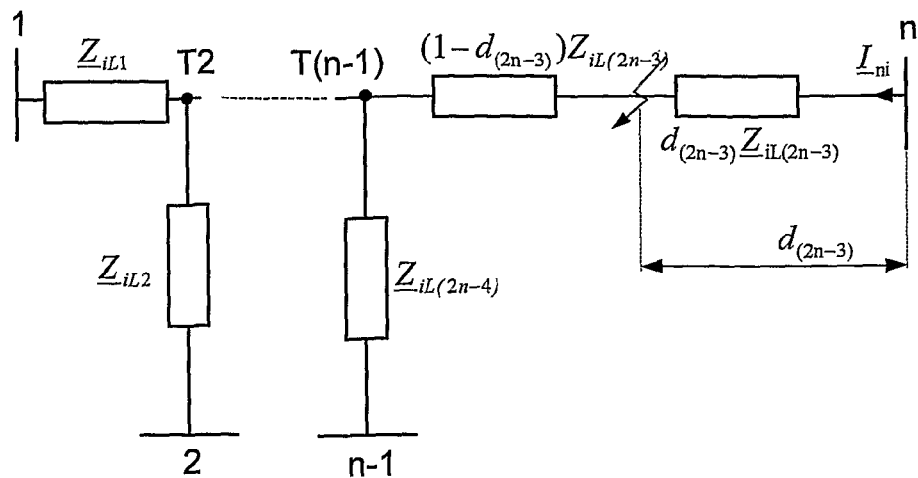
Figure 17:
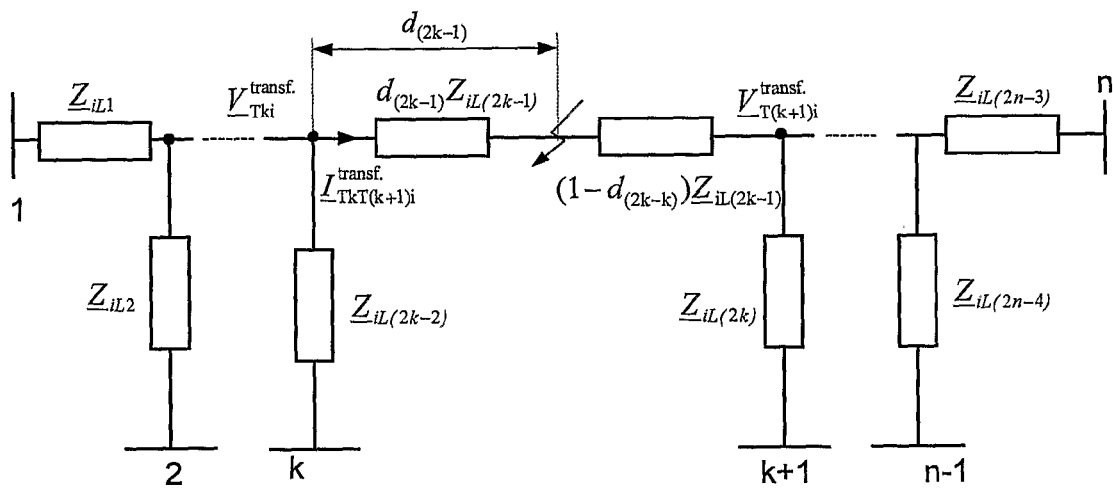
Figure 18:
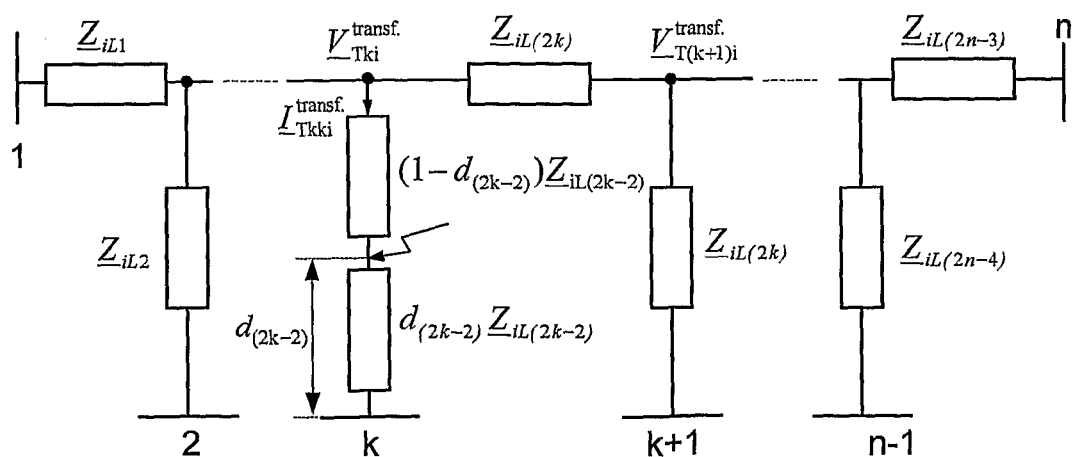

The network of actions shown in FIG. 13 includes the following actions for the implementation of the invention:

current and voltage measurement as per point 1 of the example embodiment of the invention, determination of the symmetrical components of the measured currents and voltages and calculation of the total fault current as per point 2 of the invention embodiment example, calculation of three hypothetical distances to the fault points and three fault resistances assuming that the fault occurred in section LA, section LB and section LC, as per points: 3.1.a-3.2.a, 3.1.b-3.4.b, 3.1.c-3.3.c of the invention embodiment example, checking whether the particular hypothetical distances are contained in the interval from 0 to 1 in relative units and rejection of those hypothetical distances whose values are negative or bigger than 1, according to point 4 of the invention embodiment example.

checking whether the fault resistance values are bigger than or equal to zero and rejection of values less than zero, according to point 5 of the invention embodiment example, calculation of the impedance of equivalent sources of individual sections assuming that the fault occurred in the given section, as per points 8-13 of the invention embodiment example, selection of the correct result, as per point 14 of the invention embodiment example.

The described example applies to a double phase-to-earth fault of the type (a-b-g). Yet this method is analogous for other types of faults. If other types of faults are analysed, the relevant coefficients $a_{F1}$, $a_{F2}$, $a_{F0}$, $a_1$, $a_2$, $a_0$ change. The values of these coefficients are compiled in tables 1-4. The method for fault location in three-terminal electric power transmission lines according to the present invention covers also other types of faults, i.e. (a-g, b-g, c-g, a-b, b-c, c-a, b-c-g, c-a-g, a-b-c, a-b-c-g).

The inventive method is not restricted to one line model presented in the example of the analysis, but it can apply to another model, not shown in the figure, in which model the presence of series compensating capacitors in the line section with a fault is assumed. In such case the equations (6), (11), (15) applicable to fault loop current will be modified due to the existence of these capacitors.

The inventive method uses synchronous measurements of currents in three stations of the transmission or distribution system, additionally it employs voltage measurement in the station where the fault locator is installed. Such availability of input signals is not considered in other solutions that are currently in use.

The selection of the valid result is based on the aggregation of three criterion quantities: distance to the fault point, fault resistance in the fault point and the module of impedance of equivalent source systems for those stations where voltage is not measured. This third criterion is innovative and has not been known till now.

An Example of the Invention Embodiment for a Multi-Terminal Power Line.

Figure 14:
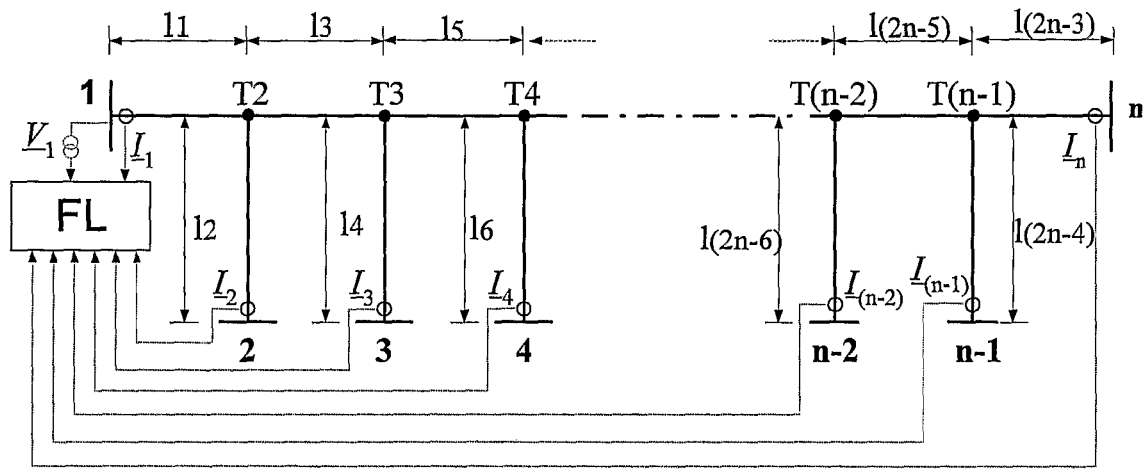
Figure 15:
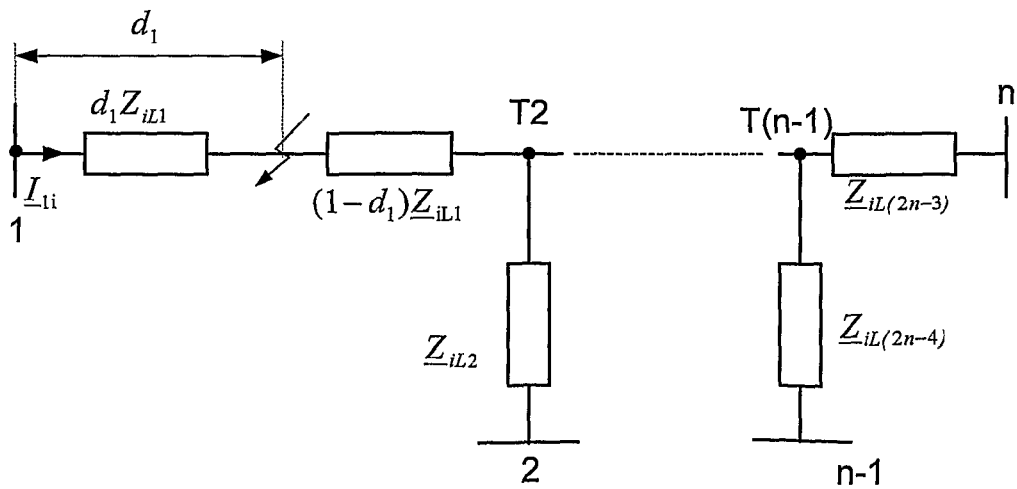

The transmission or distribution system shown in FIG. 14 consists of 1, 2, . . . , n electric power stations. Station 1 is at the beginning of the line, the $n^{th}$ station is at the end of the line. Tap points T1, T2, . . . T(n−1) divide the transmission system into line sections L1, L2, . . . , L(2n−3). In station 1 there is a fault locator FL. Fault location is done using models of faults and fault loops for symmetrical components and taking into consideration different types of faults at the same time, by applying suitable share coefficients determining the relation between the symmetrical components of the total fault current when voltage drop across the fault resistance is estimated, defined as $a_{F1}$, $a_{F2}$, $a_{F0}$ and weight coefficients $a_1$, $a_2$, $a_0$ defining the share of individual components in the total model of a fault loop. The analysis of boundary conditions for different types of faults indicates the existence of a certain degree of freedom at determining share coefficients determining the relation between the symmetrical components of the total fault current when voltage drop across the fault resistance is estimated. Their selection depends on the adopted preference in the use of individual components depending on the type of the fault. In the presented example of the invention embodiment, in order to ensure high precision of fault location, voltage drop across the fault resistance is estimated using:

the negative component of the total fault current for phase-to-earth faults (a-g), (b-g), (c-g) and phase-to-phase faults (a-b), (b-c) and (c-a), the negative component and the zero sequence component for double phase-to-earth faults (a-b-g), (b-c-g), (c-a-g), incremental positive-sequence component for three-phase faults (a-b-c, a-b-c-g) for which the fault value is decreased by the pre-fault value of the positive sequence component of current.

The recommended share coefficients determining the relation between the symmetrical components of the total fault current when voltage drop across the fault resistance is estimated are presented in table 5. The type of the fault is denoted by symbols: a-g, b-g, c-g, a-b, b-c, c-a, a-b-g, b-c-g, c-a-g, a-b-c, a-b-c-g where letters a, b, c denote individual phases of the current, and letter g denotes earthing (ground), index 1 denotes the positive-sequence component, index 2—the negative sequence component, and index 0—the zero sequence component.

TABLE 5

| Fault | $a_{F1}$ | $a_{F2}$ | $a_{F0}$ |
|---|---|---|---|
| a-g | 0 | 3 | 0 |
| b-g | 0 | $1.5 + j1.5\sqrt{3}$ | 0 |
| c-g | 0 | $-1.5 - j1.5\sqrt{3}$ | 0 |
| a-b | 0 | $1.5 - j1.5\sqrt{3}$ | 0 |
| b-c | 0 | $j\sqrt{3}$ | 0 |
| c-a | 0 | $-1.5 - j0.5\sqrt{3}$ | 0 |
| a-b-g | 0 | $3 - j\sqrt{3}$ | $j\sqrt{3}$ |
| b-c-g | 0 | $j2\sqrt{3}$ | $j\sqrt{3}$ |
| c-a-g | 0 | $-3 - j\sqrt{3}$ | $j\sqrt{3}$ |
| a-b-c | $1.5 + j0.5\sqrt{3}$ | $1.5 - j0.5\sqrt{3}$ )* | 0 |
| a-b-c-g | | | |

)* due to the lack of the negative component this coefficient may be adopted as = 0

In table 6 there are compiled share coefficients of individual current components $a_1$, $a_2$, $a_0$, defining the share of individual components in the total model of the fault loop.

TABLE 6

| FAULT | $a_1$ | $a_2$ | $a_0$ |
|---|---|---|---|
| a-g | 1 | 1 | 1 |
| b-g | $-0.5 - j0.5\sqrt{3}$ | $0.5 + j0.5\sqrt{3}$ | 1 |
| c-g | $0.5 + j0.5\sqrt{3}$ | $-0.5 - j0.5\sqrt{3}$ | 1 |
| a-b, a-b-g | $1.5 + j0.5\sqrt{3}$ | $1.5 - j0.5\sqrt{3}$ | 0 |
| a-b-c, a-b-c-g | | | |
| b-c, b-c-g | $-j\sqrt{3}$ | $j\sqrt{3}$ | 0 |
| c-a, c-a-g | $-1.5 + j0.5\sqrt{3}$ | $-1.5 - j0.5\sqrt{3}$ | 0 |

Synchronised measurements of phase currents from all terminal stations of lines 1, 2, . . . , n and phase voltages only from station 1 are supplied to the fault locator FL. Additionally, it is assumed that information about the type of the fault and the time of its occurrence is supplied to the fault locator. The fault location process assuming that it is a fault of the type (a-b-g)—phase-to-phase-to earth fault is as follows:

I'. Stage One'

1'. Operation 610. Input current signals from individual lines for fault and pre-fault conditions are measured in stations 1, 2, . . . , n. Phase voltages of the line for fault and pre-fault conditions are measured in station 1. Next, symmetrical components of phase currents measured in stations 1, 2, . . . , n, and of phase voltages measured in station 1 are calculated.

2'. Operation 620. Total fault current ($I_F$) is calculated from this equation:

$$I_F = a_{F1}I_{F1} + a_{F2}I_{F2} + a_{F0}I_{F0} \quad (24)$$

where:
the first lower index "F" denotes the fault condition, the second lower index "1" denotes the positive sequence component, "2"—the negative sequence component, "0"—the zero sequence component,
$a_{F1}, a_{F2}, a_{F0}$—the coefficients presented in table 2,
The symmetrical components of total fault current are determined as the sum of individual symmetrical components of currents determined in all terminal stations 1, 2, . . . , n:

$$I_{F1} = I_{11} + I_{21} + I_{31} + \ldots + I_{(n-1)1} + I_{n1} \quad (25),$$

$$I_{F2} = I_{12} + I_{22} + I_{32} + \ldots + I_{(n-1)2} + I_{n2} \quad (26),$$

$$I_{F0} = I_{10} + I_{20} + I_{30} + \ldots + I_{(n-1)0} + I_{n0} \quad (27)$$

where: the first lower index denotes the station, the second lower index denotes: 1—the positive sequence component, 2—the negative component, 0—the zero sequence component.

II'. Stage Two'

In stage two' a hypothetical fault point is assumed and the distance between the end of the given line and the hypothetical fault point is calculated (actions performed in operations 630a, 630b, 630c, 630d), on the following assumptions:

calculation of the distance from the beginning of the line to the fault point assuming that the fault occurred in the first line section L1—actions 3.1.a' calculation of the distance from the end of the line to the fault point assuming that the fault occurred in the terminal line section L(2n–3)—actions 3.1.b'-3.3.b'.

calculation of the distance from the end of the tapped line to the fault point assuming that the fault is located in the $k^{th}$ tapped line—actions 3.1.c'-3.2.c', calculation of the distance from tap point T(k) to the fault point assuming that the fault is located in the line section between two tap points—actions 3.1.d'-3.3d'.

3.1.a'. The voltage and current of the fault loop is determined from the relation between the symmetrical components (FIG. 2-4), (actions performed in operations 630a):

$$V_{1p} = a_1 V_{11} + a_2 V_{12} + a_0 V_{10}, \quad (28)$$

$$I_{1p} = a_1 I_{11} + a_2 I_{12} + a_0 \frac{Z_{0L1}}{Z_{1L1}} I_{10} \quad (29)$$

where:
$V_{11}, V_{12}, V_{10}$—voltage measured in station 1 (the first lower index) for individual symmetrical components, (the second lower index) i.e. the positive sequence component—index 1, negative component—index 2 and zero sequence component—index 0.
$I_{11}, I_{12}, I_{10}$—currents measured in station 1 (the first lower index) for individual symmetrical components, (the second lower index) i.e. the positive sequence component—index 1, negative component—index 2 and zero sequence component—index 0.
$Z_{1L1}$—impedance of line section L1 for the positive sequence component,
$Z_{0L1}$—impedance of line section L1 for the zero sequence component,
$a_1, a_2, a_0$,—weight coefficients compiled in table 2.
Fault loop equation has the following form:

$$V_{1p} - d_1 Z_{1L1} I_{1p} - R_{1F} I_F = 0 \quad (30)$$

When the equation (30) has been written out separately for the real part and the imaginary part and further mathematical transformations have been performed, these equations for the searched distance to the fault point (31) and fault resistance (32) are obtained.

$$d_1 = \frac{\text{real}(V_{1p})\text{imag}(I_F) - \text{imag}(V_{1p})\text{real}(I_F)}{\text{real}(Z_{1L1}I_{1p})\text{imag}(I_F) - \text{imag}(Z_{1L1}I_{1p})\text{real}(I_F)}, \quad (31)$$

$$R_{1F} = \frac{1}{2}\left[\frac{\text{real}(V_{1p}) - d_1\text{real}(Z_{1L1}I_{1p})}{\text{real}(I_F)} + \frac{\text{imag}(V_{1p}) - d_1\text{imag}(Z_{1L1}I_{1p})}{\text{imag}(I_F)}\right], \quad (32)$$

where:
"real" denotes the real part of the given complex quantity,
"imag" denotes the imaginary part of the given complex quantity,
$V_{1p}$—denotes the voltage of the fault loop as per the formula (28)
$I_F$—denotes the total fault current as per the formula (25),
$Z_{1L1}$—denotes the impedance of the line section L1 for the positive sequence component,
$I_{1p}$—denotes the fault loop current determined as per the formula (29).

3.1.b'. Voltages for symmetrical components $V_{T11}^{transf.}$, $V_{T12}^{transf.}$, $V_{T10}^{transf.}$ in the first tap point T2 are calculated, (actions performed in operations 630b):

$$V_{T2i}^{transf.} = V_{1i} - Z_{iL1} \cdot I_{1i}, \quad (33)$$

where:
$Z_{iL1}$—impedance of section L1 respectively for the positive and negative components and for the zero sequence component.

3.2.b' Voltages for symmetrical components $V_{T(n-1)1}^{transf.}$, $V_{T(n-1)2}^{transf.}$, $V_{T(n-4)0}^{transf.}$ in the final tap point T(n-1) are calculated (actions performed in operations 630b):

$$V_{T(n-1)i}^{transf.} = V_{T(n-2)i}^{transf.} - Z_{iL(2n-5)} \cdot \sum_{\substack{j=1 \\ i=1,2,3}}^{n-2} I_{ji}, \quad (34)$$

where:

$Z_{iL(2n-3)}$—impedance of line section L(2n-3) respectively for the positive and negative components and for the zero sequence component.

At the same time voltages in the $k^{th}$ tap point $V_{Tk1}^{transf.}$, $V_{Tk2}^{transf.}$, $V_{Tk0}^{transf.}$ are determined from the following formula:

$$V_{Tki}^{transf.} = V_{T(k-1)i}^{transf.} - Z_{iL(2k-3)} \cdot \sum_{\substack{j=1 \\ i=1,2,3}}^{k-1} I_{ji} \quad (35)$$

where:

$V_{T(k-1)i}^{transf.}$—calculated voltage in point (k-1), $Z_{iL(2k-3)}$—impedance of line section L(2k-3) for the symmetrical components.

3.3.b'. The values of current $I_{T(n-1)n1}^{transf.}$, $I_{T(n-1)n2}^{transf.}$, $I_{T(n-1)n0}^{transf.}$ flowing from tap point T(n-1) to station n in line section L(2n-3) are calculated, (actions performed in operations 630b):

$$I_{T(n-1)ni}^{transf.} = \sum_{\substack{j=1 \\ i=1,2,0}}^{n-1} I_{ji}, \quad (36)$$

Fault loop equation has the following form:

$$V_{T(n-1)np} - (1-d_{(2n-3)})Z_{1L(2n-3)}I_{T(n-1)np} - R_{(2n-3)F}I_F = 0 \quad (37)$$

where:

$$V_{T(n-1)np} = a_1 V_{T(n-1)1}^{transf.} + a_2 V_{T(n-1)2}^{transf.} + a_0 V_{T(n-1)0}^{transf.} \quad (37a)$$

$$I_{T(n-1)np} = a_1 I_{T(2n-1)n1}^{transf.} + a_2 I_{T(n-1)n2}^{transf.} + a_0 \frac{Z_{0L(2n-3)}}{Z_{1L(2n-3)}} I_{T(n-1)n0}^{transf.} \quad (37b)$$

When the equation (37) has been written out separately for the real part and the imaginary part and further mathematical transformations have been performed, solutions for the searched distance to the fault point $d_{(2n-3)}$ (38) and fault resistance $R_{(2n-3)B}$ (39) are obtained:

$$d_{(2n-3)} = \frac{-\text{real}(V_{T(n-1)np} - Z_{1L(2n-3)}I_{T(n-1)np})\text{imag}(I_F) +}{\text{real}(Z_{1L(2n-3)}I_{T(n-1)np})\text{imag}(I_F) -} \quad (38)$$
$$\frac{\text{imag}(V_{T(n-1)np} - Z_{1L(2n-3)}I_{T(n-1)np})\text{real}(I_F)}{\text{imag}(Z_{1L(2n-3)}I_{T(n-1)np})\text{real}(I_F)}$$

$$R_{(2n-3)F} = \frac{1}{2}\left[\frac{\text{real}(V_{T(n-1)np}) - (1-d_{(2n-3)}) \cdot \text{real}(Z_{1L(2n-3)}I_{T(n-1)np})}{\text{real}(I_F)}\right] + \frac{1}{2}\left[\frac{\text{imag}(V_{T(n-1)np}) - (1-d_{(3n-3)}) \cdot \text{imag}(Z_{1(2n-3)}I_{T(n-1)np})}{\text{imag}(I_F)}\right], \quad (39)$$

where:

$Z_{1L(2n-3)}$—impedance of line section L(2n-3) for the positive sequence component, $Z_{0L(2n-3)}$—impedance of line section L(2n-3) for the zero sequence component.

3.1.c'. Voltages for symmetrical components $V_{Tk1}^{transf.}$, $V_{Tk2}^{transf.}$, $V_{Tk0}^{transf.}$ in the 0 tap point Tk are calculated from the formula (35) assuming as k the number of the considered station equal to the number of the tap point Tk from which the line in which we consider the fault goes to station k (actions performed in operations 630c).

3.2.c'. The values of current $I_{Tkk1}^{transf.}$, $I_{Tkk2}^{transf.}$, $I_{Tkk0}^{transf.}$ flowing from tap point Tk to $k^{th}$ station in tapped line section L(2k-2) are calculated (actions performed in operations 630c):

$$I_{Tkki}^{transf} = \sum_{\substack{i=1,2,3 \\ j=1, j\neq k}}^{n} I_{ji}, \quad (40)$$

Fault loop equation has the following form:

$$V_{Tkkp} - (1-d_{(2k-2)})Z_{1L(2k-2)}I_{Tkkp} - R_{(2k-2)k}I_F = 0 \quad (41)$$

where:

$$V_{Tkkp} = a_1 V_{Tkk1}^{transf.} + a_2 V_{Tkk2}^{transf.} + a_0 V_{Tkk0}^{transf.} \quad (41a)$$

$$I_{Tkkp} = a_1 I_{Tkk1}^{transf.} + a_2 I_{Tkk1}^{transf.} + a_0 \frac{Z_{0L(2k-2)}}{Z_{1L(2k-2)}} I_{Tkk0}^{transf.} \quad (41b)$$

When the equation (40) has been written out separately for the real part and the imaginary part and further mathematical transformations have been performed, solutions for the searched distance to the fault point $d_{(2k-2)}$ (42) and fault resistance $R_{(2k-2)F}$ (43) are obtained:

$$d_{(2k-2)} = \frac{-\text{real}(V_{Tkkp} - Z_{1L(2k-2)}I_{Tkkp})\text{imag}(I_F) +}{\text{real}(Z_{1L(2k-2)}I_{Tkkp})\text{imag}(I_F) -} \quad (42)$$
$$\frac{\text{imag}(V_{Tkkp} - Z_{1L(2k-2)}I_{Tkkp})\text{real}(I_F)}{\text{imag}(Z_{1L(2k-2)}I_{Tkkp})\text{real}(I_F)}$$

$$R_{(2k-2)F} = \frac{1}{2}\left[\frac{\text{real}(V_{Tkkp}) - (1-d_{(2k-2)}) \cdot \text{real}(Z_{1L(2k-2)}I_{Tkkp})}{\text{real}(I_F)}\right] + \frac{1}{2}\left[\frac{\text{imag}(V_{Tkkp}) - (1-d_{(2k-2)}) \cdot \text{imag}(Z_{1L(2k-2)}I_{Tkkp})}{\text{imag}(I_F)}\right] \quad (43)$$

where:

$Z_{1L(2k-2)}$—impedance of line section L(2k-2) for the positive sequence component, $Z_{0L(2k-2)}$—impedance of line section L(2k-2) for the zero sequence component.

3.1.d'. Voltages for symmetrical components $V_{Tk1}^{transf.}$, $V_{Tk2}^{transf.}$, $V_{Tk0}^{transf.}$ in the $k^{th}$ tap point Tk are calculated from the formula (35), (actions performed in operations 630*d*).

3.2.d'. The values of current $I_{TkT(k+1)1}^{transf.}$, $I_{TkT(k+1)2}^{transf.}$, $I_{TkT(k+1)0}^{transf.}$ flowing from tap point Tk to tap point T(k+1) in the line section are calculated (actions performed in operations 630*d*):

$$I_{TkT(k+1)i}^{transf.} = \sum_{\substack{i=1,2,0 \\ j=1}}^{k-1} I_{ji}, \tag{44}$$

Fault loop equation has the following form:

$$\underline{V}_{TkT(k+1)p} - (1 - d_{(k+1)})\underline{Z}_{1L(2k-1)}\underline{I}_{TkT(k+1)p} - R_{(2k-1)F}\underline{I}_F = 0 \tag{45}$$

where:

$$\underline{V}_{TkT(k+1)p} = \underline{a}_1 \underline{V}_{Tk1}^{transf.} + \underline{a}_2 \underline{V}_{Tk2}^{transf.} + \underline{a}_0 \underline{V}_{Tk0}^{transf.} \tag{45a}$$

$$\underline{I}_{TkT(k+1)p} = \underline{a}_1 I_{TkT(k+1)1}^{transf.} + \underline{a}_2 I_{TkT(k+1)2}^{transf.} + \underline{a}_0 \frac{Z_{0L(k+1)}}{Z_{1L(k+1)}} I_{TkT(k+1)0}^{transf.} \tag{45b}$$

When the equation (45) has been written out separately for the real part and the imaginary part and further mathematical transformations have been performed, equations for the searched distance to the fault point $d_{(2k-1)}$ (46) and fault resistance $R_{(2k-1)F}$ (47) are obtained:

$$d_{(2k-1)} = \frac{-\text{real}(\underline{V}_{TkT(k+1)p} - \underline{Z}_{1L(2k-1)}\underline{I}_{TkT(k+1)p})\text{imag}(\underline{I}_F) + \text{imag}(\underline{V}_{TkT(k+1)p} - \underline{Z}_{1L(2k-1)}\underline{I}_{TkT(k+1)p})\text{real}(\underline{I}_F)}{\text{real}(\underline{Z}_{1L(2k-1)}\underline{I}_{TkT(k+1)p})\text{imag}(\underline{I}_F) - \text{imag}(\underline{Z}_{1L(2k-1)}\underline{I}_{TkT(k+1)p})\text{real}(\underline{I}_F)}, \tag{46}$$

$$R_{(2k-1)F} = \tag{47}$$
$$\frac{1}{2}\left[\frac{\text{real}(\underline{V}_{TkT(k+1)p}) - (1 - d_{(2k-1)}) \cdot \text{real}(\underline{Z}_{1L(2k-1)}\underline{I}_{TkT(k+1)p})}{\text{real}(\underline{I}_F)}\right] + $$
$$\frac{1}{2}\left[\frac{\text{imag}(\underline{V}_{TkT(k+1)p}) - (1 - d_{(2k-1)}) \cdot \text{imag}(\underline{Z}_{1L(2k-1)}\underline{I}_{TkT(k+1)p})}{\text{imag}(\underline{I}_F)}\right],$$

where:

$\underline{Z}_{1L(2k-1)}$—impedance of line section L(2k-1) for the positive sequence component, $\underline{Z}_{0L(2k-1)}$—impedance of line section L(2k-1) for the zero sequence component.

k—number of the tap point

III'. Stage Three'

In this stage the selection of the final results is done (actions performed in operations 640*a*, 640*b*, 640*c*, 640*d*).

4'. It is checked whether the results of the calculation of the distance $d_1$, $d_{(2n-3)}$, $d_{(2k-2)}$, $d_{(2k-1)}$, to the fault point are contained within the interval (0÷1) in relative units: $0 \leq d_1 \leq 1, 0 \leq d_{(2n-3)} \leq 1, 0 \leq d_{(2k-2)} \leq 1, 0 \leq d_{(2k-1)} \leq 1$, and it is checked whether the results of the calculation of fault resistance $R_{1F}$, $R_{(2n-3)F}$, $R_{(2k-2)F}$, $R_{(2k-1)F}$, for the calculated fault points $d_1$, $d_{(2n-3)}$, $d_{(2k-2)}$, $d_{(2k-1)}$, are bigger than or equal to zero. The pairs of results: resistance-distance, e.g.: $d_1$, $R_{1F}$ which are not contained within the given intervals indicate that they were calculated on a false pre-assumption concerning the place of occurrence of the fault on the given line section. These results shall be discarded. The other results undergo further treatment except the case where only one pair is within the given interval. These results are final, i.e. they indicate the fault location and the fault resistance at the fault point (Operation 650).

5'. If the analysis of the criteria performed as in actions 4' does not provide an explicit conclusion about which values define the place and resistance of the fault then, in subsequent actions, equivalent source impedance for the negative component is calculated for these faults: phase-to-earth, phase-to-phase, double phase-to-earth or alternatively for the incremental positive sequence component. For three-phase faults, the impedance of equivalent source systems is calculated for the incremental positive sequence component. (Actions performed in operations 660*a*, 660*b*, 660*c*, 660*d*).

7'. Total fault current $\underline{I}_{F2}$ for the negative sequence component is calculated from the following formula (actions performed in operations 660*a*), $$\underline{I}_{F2} = \sum_{j=1}^{n} \underline{I}_{j2} \tag{48}$$

8'. Equivalent source impedance $(\underline{Z}_{2S1})$ is calculated assuming that the fault is located in line section L1, (actions performed in operations 660*a*):

$$(\underline{Z}_{2S1}) = \frac{-\underline{V}_{12}}{\underline{I}_{12}}, \tag{49}$$

9'. Equivalent source impedance $(\underline{Z}_{2S(n)})$ is calculated assuming that the fault is located in the final line section L(2n-3), (actions performed in operations 660*b*):

$$(\underline{Z}_{2Sn}) = -\frac{\underline{V}_{n2}}{\underline{I}_{n2}} \tag{50}$$

where:

$$\underline{V}_{n2} = \underline{V}_{T(n-1)2}^{transf.} - (1 - d_{(2n-3)}) \cdot \underline{Z}_{2L(2n-3)} \cdot \underline{I}_{T(n-1)n2}^{transf.} - \tag{51}$$
$$d_{(2n-3)} \cdot \underline{Z}_{2L(2n-3)} \cdot (\underline{I}_{T(n-1)n2}^{transf.} - \underline{I}_{F2})$$

10'. Impedance of $k^{th}$ equivalent source $(\underline{Z}_{2Sk})$ is calculated assuming that the fault is located in tapped line section L(2k-2), (actions performed in operations 660*c*):

$$(\underline{Z}_{2Sk}) = -\frac{\underline{V}_{k2}}{\underline{I}_{k2}} \tag{52}$$

where:

$$\underline{V}_{k2} = \underline{V}_{Tk2}^{transf.} - (1 - d_{(2k-2)}) \cdot \underline{Z}_{2L(2k-2)} \cdot \underline{I}_{Tkk2}^{transf.} - \tag{53}$$
$$d_{(2k-2)} \cdot \underline{Z}_{2L(2k-2)} \cdot (\underline{I}_{Tkk2}^{transf.} - \underline{I}_{F2})$$

11'. Impedance of equivalent sources $(\underline{Z}_{2Sk})$ and $(\underline{Z}_{2S(k+1)})$ is calculated on the assumption that the fault is located in the line section between two tap points Tk–T(k+1), (actions performed in operations 660*d*):

$$(Z_{2Sk}) = -\frac{V_{k2}}{I_{k2}} \quad (54)$$

where:

$$\underline{V}_{k2} = \underline{V}_{Tk2}^{transf.} - d_{(2k-1)} \cdot Z_{2L(2k-1)} \cdot I_{TkT(k+1)2}^{transf.} - \quad (55)$$
$$(1 - d_{(2k-1)}) \cdot Z_{2L(2k-1)} \cdot \left(I_{TkT(k+1)2}^{transf.} - I_{F2}\right) + Z_{2Lk}I_{k2}$$

$$(Z_{2S(k+1)}) = -\frac{V_{(k+1)2}}{I_{(k+1)2}} \quad (56)$$

where:

$$\underline{V}_{(k+1)2} = \underline{V}_{Tk2}^{transf.} - d_{(2k-1)} \cdot Z_{2L(2k-1)} \cdot I_{TkT(k+1)2}^{transf.} - \quad (57)$$
$$(1 - d_{(2k-1)}) \cdot Z_{2L(2k-1)} \cdot \left(I_{TkT(k+1)2}^{transf.} - I_{F2}\right) + Z_{2Lk(2k)}I_{(k+1)2}$$

12'. It is checked (actions performed in operations 670a, 670b, 670c, 670d) whether the calculated equivalent source impedances ($\underline{Z}_{2S1}$), ($\underline{Z}_{2Sn}$), ($\underline{Z}_{2SC}$)$_{SUB\_C}$, ($\underline{Z}_{2Sk}$), ($\underline{Z}_{2S(k+1)}$) are contained in the interval in the first quadrant of the complex plane Z, that is, whether both the real and the imaginary part of the calculated impedance is greater than zero. The impedance of equivalent source systems is determined for the negative component for occurrence of the faults: phase-to-earth, phase-to-phase, double phase-to-earth or alternatively for the incremental positive sequence component. For three-phase faults the impedance of equivalent source systems is calculated for the incremental positive sequence component. Results which are not contained within the first quadrant suggest that they were calculated on a false pre-assumption concerning the location of the fault on the given line section and the result of the calculation of the distance to the fault point made on that assumption is rejected. The remaining results undergo further treatment except the case where only one impedance calculated on the assumption that the fault occurred in the given line section is contained in the first quadrant. The result of the calculation of the distance to the fault point for that impedance indicates a correct pre-assumption. This result is considered final (actions performed in operation 680).

13'. If the criteria analysis performed as in action 12' does not provide an explicit conclusion about which values define the location of the fault, then, in subsequent actions (actions performed in operations 690a, 690b, 690c, 690d), the calculated equivalent source impedances are transformed into a modular form, whereupon the correct result is selected on the basis of the equivalent source impedance module.

14'. Operation 700. If the calculated value of the equivalent source system impedance module, assuming the occurrence of the fault on the given line section, does not correspond to the real value of the source system impedance module, this means that the preliminary data concerning the fault location in the given section have been assumed falsely and the result of the calculation of the distance to the fault point based on this assumption is rejected. If the calculated value of the equivalent source system impedance module, assuming the occurrence of the fault on the given line section, corresponds to the real value of the module of impedance of the source system, then the result of the calculation of the distance to the fault confirms the correct pre-assumption and this result is considered final.

Figure 19A:
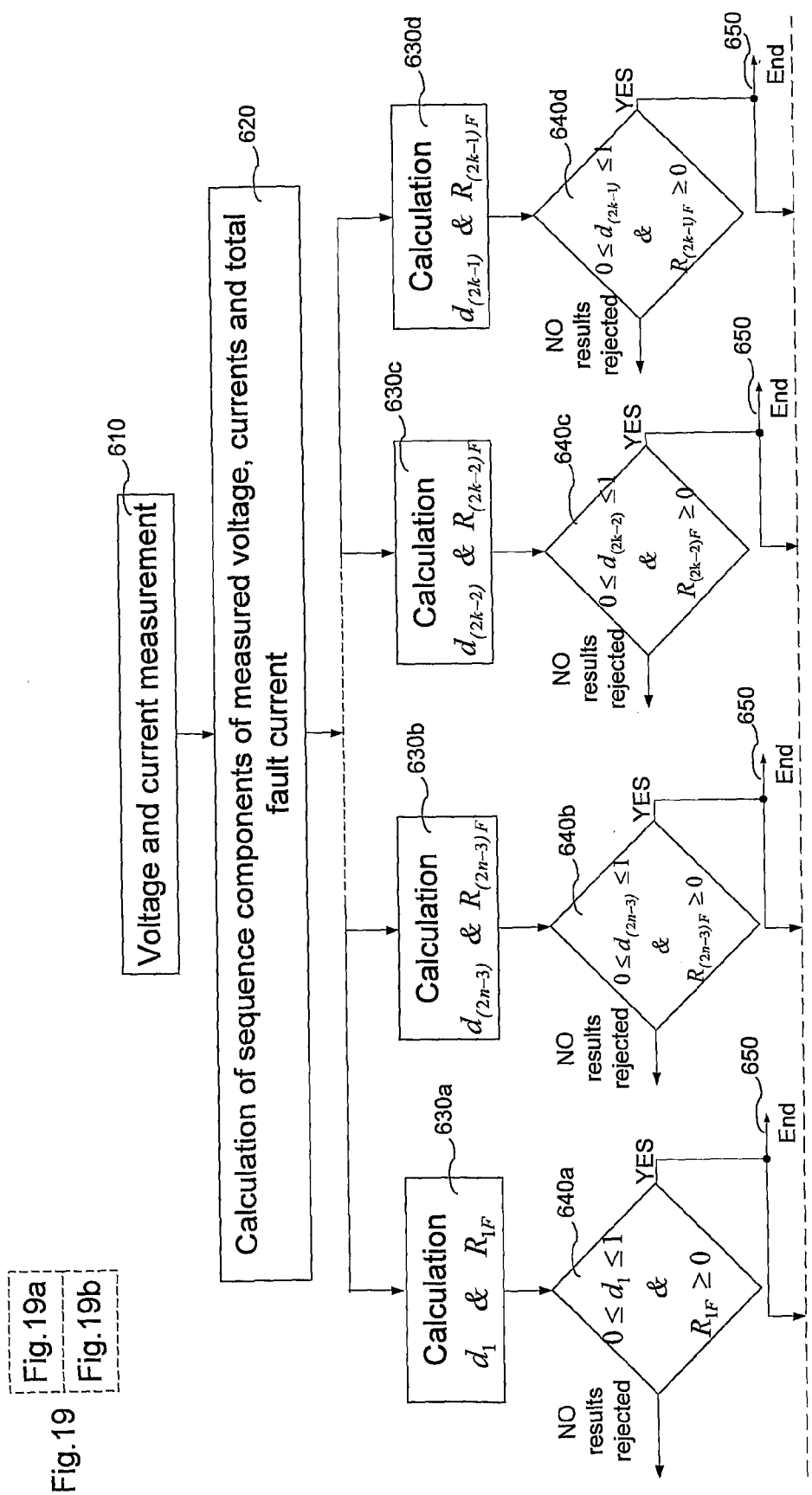
FIG. 19A and FIG. 19B show the network of actions performed when locating faults on the basis of the inventive method for a multi-terminal electric power line.
Figure 19B:
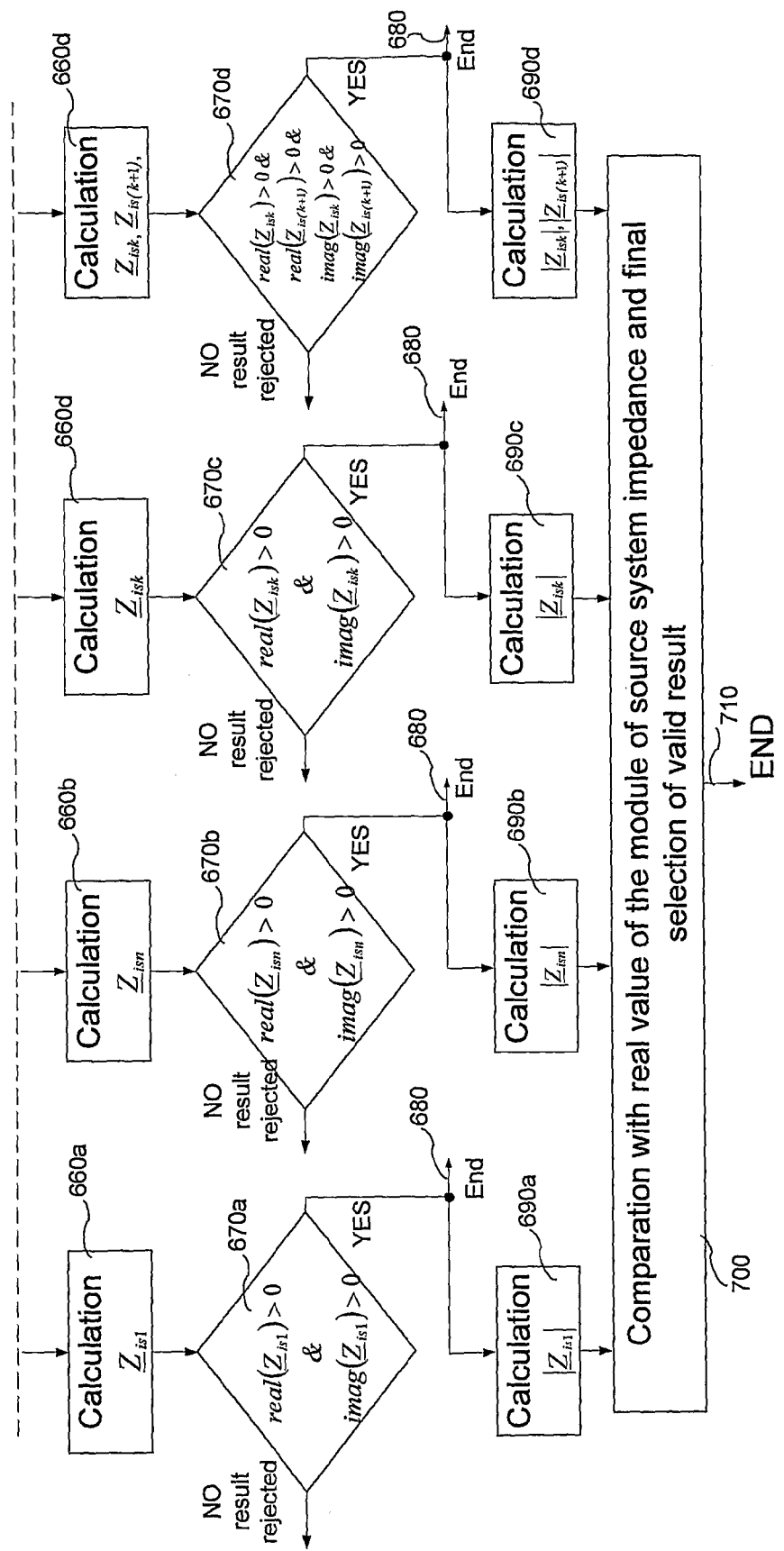

The network of actions shown in FIG. 19 includes the following actions for the implementation of the invention:

measurement of currents and voltages according to point 1' of the invention embodiment example, determination of the symmetrical components of measured currents and voltages and calculation of the total fault current according to point 2' of the invention embodiment example, calculation of the consecutive hypothetical distances to the fault points and the fault resistance assuming that the fault is located in the first line section L1, the terminal line section L(2n–3), sections of tapped lines (2k–2) and sections between consecutive tap point (2k–1), according to points: 3.1.a'-3.2.a', 3.1.b'-3.4.b', 3.1.c'-3.3.c', 3.1.d'-3.3.d' of the invention embodiment example checking whether the particular hypothetical distances are contained in the interval from 0 to 1 in relative units and rejection of those hypothetical distances whose values are negative or bigger than 1, according to point 4 of the example embodiment of the invention.

checking whether the values of the fault resistance are bigger than or equal to zero and rejection of values less than zero, according to point 5' of the invention embodiment example, calculation of the impedance of equivalent sources of individual sections assuming that the fault is located in the given section, as per points 8'-11' of the invention embodiment example, selection of the correct result, according to point 12' of the invention embodiment example by rejecting those hypothetical distances for which impedances of calculated equivalent sources are not within the first quadrant of the complex system of co-ordinates, selection of the final result according to point 14' of the invention embodiment example, by rejecting those hypothetical distances for which the calculated value of the module of impedance of equivalent source systems does not correspond to the real value of the module of the equivalent source system.

The described example refers to a double phase-to-earth fault of the type (a-b-g). Yet this method is analogous for other types of faults. If other types of faults are analysed, the relevant coefficients $a_{F1}, a_{F2}, a_{F0}, a_1, a_2, a_0$ change. The values of these coefficients are compiled in tables 5-6. The method for fault location in multi-terminal electric power transmission lines according to the present invention covers also other types of faults i.e. (a-g, b-g, c-g, a-b, b-c, c-a, b-c-g, c-a-g, a-b-c, a-b-c-g).

The inventive method is not restricted to one line model presented in the example of the analysis, but it can apply to another model, not shown in the figure, e.g. a long line model. In such case the equations (33-57) will be modified.

The inventive method uses synchronous measurements of currents in all stations of the transmission or distribution system, additionally it uses voltage measurement in the station where the fault locator is installed.

The selection of the valid result is based on the aggregation of the three calculated criterion-type quantities: distance to the fault point, fault resistance in the fault point and impedance of equivalent source systems for those stations where voltage measurement is not done. This third criterion is a two-stage one, i.e. first it is checked whether the determined impedances of equivalent source systems are in the first quadrant of the complex plane Z and then their modules are determined. This first element of the third criterion is innovative and has not been known till now. Its advantage is that knowledge of the equivalent source system impedance is not required for its implementation. Therefore, inaccurate knowledge of these impedances, which is normal in practice, is of no consequence.

The invention claimed is:

1. A method using models of faults and fault loops for symmetrical components and different types of faults in a fault locator for locating a fault in electric power lines of a transmission or a distribution system, in which division of the transmission or distribution system line into sections is used and a hypothetical location of the fault is assumed in at least one of these sections, said system having a predetermined number of terminal stations, said method comprising:

measuring current for a fault condition and a pre-fault condition in all of said predetermined number of terminal stations of the system, measuring the line phase voltage for fault and pre-fault conditions in one of said predetermined number of terminal stations of the system, calculating in said fault locator symmetrical components of the measured current and voltage signals and the total fault current in the assumed hypothetical location of the fault, assuming in said fault locator a first hypothetical location of the fault is located in a section of the electric power line between the beginning of the line and a first tap point, a second hypothetical location of the fault is located in a section of the electric power line between the end of the line and a last tap point of a branch of the electric power line, and a consecutive hypothetical location of a fault which is located in the branch, calculating in said fault locator the distance from the beginning of the line to the fault located between the beginning of the line and the first tap point, the distance from the end of the line to the fault located between the end of the line and the last tap point of the branch of the line, the distance from the end of the line to the fault located in the branch, calculating in said fault locator resistances for each of said faults, selecting in said fault locator the actual location of a fault first by comparing the numerical values concerning the previously determined distances and rejecting the results whose numerical values are negative or bigger than one (1) in relative units and then by analyzing the values of the calculated fault resistances for said faults and rejecting those results of the calculations for which the value of fault resistance is negative, and if it is found that only one numerical value concerning the distance is contained in the numerical interval between zero and one in relative units and the value of calculated fault resistance for the distance to the fault point is positive or equal to zero, then these results are final and they indicate the actual distance to the fault point and the value of fault resistance in the fault point, determining in said fault locator, impedance modules or impedances of equivalent source systems for the negative sequence component for phase-to-ground faults, phase-to-phase faults, and double phase-to-ground faults or for the incremental positive sequence component for three-phase faults when if, after the selection of the actual fault point it turns out that at least two numerical values concerning the previously calculated distances are contained within the numerical interval from zero to one in relative units and the values of the calculated fault resistances for these fault points are positive or equal to zero, and assuming that the fault occurred in a definite section, and during the impedance determination it is additionally checked whether the calculated values of the impedance of equivalent source systems are contained in the first quadrant of the Cartesian coordinate system for the complex plane and the previously calculated distances to fault locations are rejected for which impedance values are not contained in the first quadrant of the system, and if it turns out that only one value of the impedance of the equivalent source system concerning distance is contained in the first quadrant of the system, then the result of the calculation of the distance to the fault location, for the impedance, is considered to be final and said fault locator has found the location of the fault.

2. A method according to claim 1, wherein the calculation of the total fault current is done taking into account the share coefficients determining the relation between the symmetrical components of the total fault current when voltage drop across the fault resistance is estimated, a specially determined set of these coefficients being used for that operation.

3. A method according to claim 1, wherein for double phase-to-earth faults the positive component is eliminated in the estimation of the total fault current, and for the negative and zero components the following values of the share coefficients determining the relation between the symmetrical components of the total fault current when voltage drop across the fault resistance is estimated are assumed:

$$\underline{a}_{F1} = 0,$$

$$\underline{a}_{F2} = \underline{a}_{F2}^{init.} - \frac{\underline{a}_{F1}^{init.} \cdot \underline{b}_{F2}}{\underline{b}_{F1}},$$

$$\underline{a}_{F0} = \frac{\underline{a}_{F1}^{init.}}{\underline{b}_{F1}}$$

where:

$\underline{a}_{F1}^{init.}, \underline{a}_{F2}^{init.}, \underline{a}_{F0}^{init.}$—denote the initial share coefficients determining the relation between the symmetrical components of the total fault current when voltage drop across the fault resistance is estimated, $\underline{b}_{F1}, \underline{b}_{F2}$—denote relation share coefficients, determined from the relation between the zero component and the other components of the total fault current flowing through the fault resistance.

4. A method according to claim 1, wherein for three-terminal power lines, the distances from the beginning of the line to fault location $d_A$, from the end of the line to fault location $d_B$, from the end of the tapped line to fault location $d_C$ are determined from the following equations:

$$d_A = \frac{\text{real}(\underline{V}_{Ap})\text{imag}(\underline{I}_F) - \text{imag}(\underline{V}_{Ap})\text{real}(\underline{I}_F)}{\text{real}(\underline{Z}_{1LA}\underline{I}_{Ap})\text{imag}(\underline{I}_F) - \text{imag}(\underline{Z}_{1LA}\underline{I}_{Ap})\text{real}(\underline{I}_F)},$$

$$d_B = \frac{-\text{real}(\underline{V}_{Tp} - \underline{Z}_{1LB}\underline{I}_{TBp})\text{imag}(\underline{I}_F) + \text{imag}(\underline{V}_{Tp} - \underline{Z}_{1LB}\underline{I}_{TBp})\text{real}(\underline{I}_F)}{\text{real}(\underline{Z}_{1LB}\underline{I}_{TBp})\text{imag}(\underline{I}_F) - \text{imag}(\underline{Z}_{1LB}\underline{I}_{TBp})\text{real}(\underline{I}_F)},$$

-continued $$d_C = \frac{\begin{array}{l}-\text{real}(\underline{V}_{Tp} - \underline{Z}_{1LC}\underline{I}_{TCp})\text{imag}(\underline{I}_F) + \\ \text{imag}(\underline{V}_{Tp} - \underline{Z}_{1LC}\underline{I}_{TCp})\text{real}(\underline{I}_F)\end{array}}{\begin{array}{l}\text{real}(\underline{Z}_{1LC}\underline{I}_{TCp})\text{imag}(\underline{I}_F) - \\ \text{imag}(\underline{Z}_{1LC}\underline{I}_{TCp})\text{real}(\underline{I}_F)\end{array}},$$

where:
"real" denotes the real part of the given quantity,
"imag" denotes the imaginary part of the given quantity,
$\underline{V}_{AP}$—denotes the fault loop voltage determined assuming that the fault occurred in section LA,
$\underline{V}_{Tp}$—denotes the fault loop voltage determined assuming that the fault occurred in section LB or LC,
$\underline{I}_{Ap}$—denotes the fault loop current determined assuming that the fault occurred in section LA,
$\underline{I}_{TBp}$—denotes the fault loop current determined assuming that the fault occurred in section LB,
$\underline{I}_{TCp}$—denotes the fault loop current determined assuming that the fault occurred in line section LC,
$\underline{I}_F$—denotes total fault current,
$\underline{Z}_{1LA}=R_{1LA}+j\omega_1 L_{1LA}$—denotes impedance of the line section LA for the positive sequence,
$\underline{Z}_{1LC}=R_{1LC}+j\omega_1 L_{1LB}$—denotes impedance of the line section LB for the positive sequence,
$\underline{Z}_{1LC}=R_{1LC}+j\omega_1 L_{1LC}$—denotes impedance of the line section LC for the positive sequence,
$R_{1LA}, R_{1LB}, R_{1LC}$—resistance for the positive sequence for line sections LA, LB, LC, respectively,
$L_{1LA}, L_{1LB}, L_{1LC}$—inductance for the positive sequence for line sections LA, LB, LC, respectively,
$\omega_1$—pulsation for the fundamental frequency.

5. A method according to claim 1, wherein for three-terminal power lines, the fault resistance $R_{FA}, R_{FB}, R_{FC}$ is determined from the following equations:

$$R_{FA} = \frac{1}{2}\left[\frac{\text{real}(\underline{V}_{Ap}) - d_A \text{real}(\underline{Z}_{1LA}\underline{I}_{Ap})}{\text{real}(\underline{I}_F)} + \frac{\text{imag}(\underline{V}_{Ap}) - d_A \text{imag}(\underline{Z}_{1LA}\underline{I}_{Ap})}{\text{imag}(\underline{I}_F)}\right],$$

$$R_{FB} = \frac{1}{2}\left[\frac{\text{real}(\underline{V}_{Tp}) - (1 - d_B) \cdot \text{real}(\underline{Z}_{1LB}\underline{I}_{TBp})}{\text{real}(\underline{I}_F)}\right] +$$
$$\frac{1}{2}\left[\frac{\text{imag}(\underline{V}_{Tp}) - (1 - d_B) \cdot \text{imag}(\underline{Z}_{1LB}\underline{I}_{TBp})}{\text{imag}(\underline{I}_F)}\right]$$

$$R_{FC} = \frac{1}{2}\left[\frac{\text{real}(\underline{V}_{Tp}) - (1 - d_C) \cdot \text{real}(\underline{Z}_{1LC}\underline{I}_{TCp})}{\text{real}(\underline{I}_F)}\right] +$$
$$\frac{1}{2}\left[\frac{\text{imag}(\underline{V}_{Tp}) - (1 - d_C) \cdot \text{imag}(\underline{Z}_{1LC}\underline{I}_{TCp})}{\text{imag}(\underline{I}_F)}\right]$$

where:
"real" denotes the real part of the given quantity,
"imag" denotes the imaginary part of the given quantity,
$\underline{V}_{Ap}$—denotes the fault loop voltage calculated assuming that the fault occurred in section LA,
$\underline{V}_{TP}$—denotes the fault loop voltage calculated assuming that the fault occurred in section LB or LC,
$\underline{I}_{Ap}$—denotes the fault loop current calculated assuming that the fault occurred in section LA,
$\underline{I}_{TBp}$—denotes the fault loop current calculated assuming that the fault occurred in section LB,
$\underline{I}_{TCp}$—denotes the fault loop current calculated assuming that the fault occurred in line section LC,
$\underline{I}_F$—denotes the total fault current,
$\underline{Z}_{1LA}=R_{1LA}+j\omega_1 L_{1LB}$—denotes impedance of the line section LA for the positive sequence,
$\underline{Z}_{1LB}=R_{1LB}+j\omega_1 L_{1LB}$—denotes impedance of the line section LB for the positive sequence,
$\underline{Z}_{1LC}=R_{1LC}+j\omega_1 L_{1LC}$—denotes impedance of the line section LC for the positive sequence,
$R_{1LA}, R_{1LB}, R_{1LC}$—resistance for the positive sequence for line sections LA, LB, LC, respectively,
$L_{1LA}, L_{1LB}, L_{1LC}$—inductance for the positive sequence for line sections LA, LB, LC, respectively,
$\omega_1$—pulsation for the fundamental frequency,
$d_A$—denotes the distance from the beginning of the line to the fault location,
$d_B$—denotes the distance from the end of the line to the fault location,
$d_C$—denotes the distance from the end of the tapped line to the fault location.

6. A method according to claim 1, wherein for multi-terminal power lines, distances from the beginning of the line to the fault location ($d_1$), from the end of the line to the fault point ($d_{(2n-3)}$), from the end of the line to the fault location ($d_{(2k-2)}$), from the tap point to the fault location in the line section between two tap points ($d_{(2k-1)}$) are determined from the following equations:

$$d_1 = \frac{\text{real}(\underline{V}_{1p})\text{imag}(\underline{I}_F) - \text{imag}(\underline{V}_{1p})\text{real}(\underline{I}_F)}{\text{real}(\underline{Z}_{1L1}\underline{I}_{1p})\text{imag}(\underline{I}_F) - \text{imag}(\underline{Z}_{1L1}\underline{I}_{1p})\text{real}(\underline{I}_F)},$$

$$d_{(2n-3)} = \frac{\begin{array}{l}-\text{real}(\underline{V}_{T(n-1)np} - \underline{Z}_{1L(2n-3)}\underline{I}_{T(n-1)np})\text{imag}(\underline{I}_F) + \\ \text{imag}(\underline{V}_{T(n-1)np} - \underline{Z}_{1L(2n-3)}\underline{I}_{T(n-1)np})\text{real}(\underline{I}_F)\end{array}}{\begin{array}{l}\text{real}(\underline{Z}_{1L(2n-3)}\underline{I}_{T(n-1)np})\text{imag}(\underline{I}_F) - \\ \text{imag}(\underline{Z}_{1L(2n-3)}\underline{I}_{T(n-1)np})\text{real}(\underline{I}_F)\end{array}}$$

$$d_{(2k-2)} = \frac{\begin{array}{l}-\text{real}(\underline{V}_{Tkkp} - \underline{Z}_{1L(2k-2)}\underline{I}_{Tkkp})\text{imag}(\underline{I}_F) + \\ \text{imag}(\underline{V}_{Tkkp} - \underline{Z}_{1L(2k-2)}\underline{I}_{Tkkp})\text{real}(\underline{I}_F)\end{array}}{\begin{array}{l}\text{real}(\underline{Z}_{1L(2k-2)}\underline{I}_{Tkkp})\text{imag}(\underline{I}_F) - \\ \text{imag}(\underline{Z}_{1L(2k-2)}\underline{I}_{Tkkp})\text{real}(\underline{I}_F)\end{array}},$$

$$d_{(2k-1)} = \frac{\begin{array}{l}-\text{real}(\underline{V}_{TkT(k+1)p} - \underline{Z}_{1L(2k-1)}\underline{I}_{TkT(k+1)p})\text{imag}(\underline{I}_F) + \\ \text{imag}(\underline{V}_{TkT(k+1)p} - \underline{Z}_{1L(2k-1)}\underline{I}_{TkT(k+1)p})\text{real}(\underline{I}_F)\end{array}}{\begin{array}{l}\text{real}(\underline{Z}_{1L(2k-1)}\underline{I}_{TkT(k+1)p})\text{imag}(\underline{I}_F) - \\ \text{imag}(\underline{Z}_{1L(2k-1)}\underline{I}_{TkT(k+1)p})\text{real}(\underline{I}_F)\end{array}}$$

where:
$\underline{V}_{1p}$—fault loop voltage calculated under assumption that fault occurred in the first section of the line section L1,
$\underline{I}_{1p}$—fault loop current calculated under assumption that fault occurred in the first section of the line section L1,
$\underline{V}_{T(n-1)np}$—fault loop voltage calculated under assumption that fault occurred in the line section L(2n−3),
$\underline{I}_{T(n-1)np}$—fault loop current calculated under assumption that fault occurred in the line section L(2n−3),
$\underline{V}_{Tkkp}$—fault loop voltage calculated under assumption that fault occurred in the $k^{th}$ tapped line,
$\underline{I}_{Tkkp}$—fault loop current calculated under assumption that fault occurred in $k^{th}$ tapped line,
$\underline{V}_{TkT(k+1)p}$—fault loop voltage calculated under assumption that fault occurred in the line section between two tap points, $I_{TkT(k+1)p}$—fault loop current calculated under assumption that fault occurred in the line section between two tap points,
$I_F$—total fault current,
$\underline{Z}_{1L1}$—impedance of line section L1 for the positive sequence component,
$\underline{Z}_{0L1}$—impedance of line section L1 for the zero sequence component,
$\underline{Z}_{1L(2n-3)}$—impedance of line section L(2n-3) for the positive sequence component,
$\underline{Z}_{0L(2n-3)}$—impedance of line section L(2n-3) for the zero sequence component,
$\underline{Z}_{1L(2k-2)}$—impedance of line section L(2k-2) for the positive sequence component,
$\underline{Z}_{0L(2k-2)}$—impedance of line section L(2k-2) for the zero sequence component,
$\underline{Z}_{1L(2k-1)}$—impedance of line section L(2k-1) for the positive sequence component,
$\underline{Z}_{0L(2k-1)}$—impedance of line section L(2k-1) for the zero sequence component,
k—number of the tap point
n—number of the line terminal.

7. A method according to claim 1, wherein for multi-terminal electric power lines, fault resistance $(R_{1F})$, $(R_{(2n-3)F})$, $(R_{(2k-2)F})$, $(R_{(2k-1)F})$ is determined from the following equations:

$$R_{1F} = \frac{1}{2}\left[\frac{\text{real}(\underline{V}_{1p}) - d_1\text{real}(\underline{Z}_{1L1}\underline{I}_{1p})}{\text{real}(I_F)} + \frac{\text{imag}(\underline{V}_{1p}) - d_1\text{imag}(\underline{Z}_{1L1}\underline{I}_{1p})}{\text{imag}(I_F)}\right],$$

$$R_{(2n-3)F} = \frac{1}{2}\left[\frac{\text{real}(\underline{V}_{T(n-1)np}) - (1 - d_{(2n-3)})\cdot\text{real}(\underline{Z}_{1L(2n-3)}\underline{I}_{T(n-1)np})}{\text{real}(I_F)}\right] +$$
$$\frac{1}{2}\left[\frac{\text{imag}(\underline{V}_{T(n-1)np}) - (1 - d_{(2n-3)})\cdot\text{imag}(\underline{Z}_{1L(2n-3)}\underline{I}_{T(n-1)np})}{\text{imag}(I_F)}\right],$$

$$R_{(2k-2)F} = \frac{1}{2}\left[\frac{\text{real}(\underline{V}_{Tkkp}) - (1 - d_{(2k-2)})\cdot\text{real}(\underline{Z}_{1L(2k-2)}\underline{I}_{Tkkp})}{\text{real}(I_F)}\right] +$$
$$\frac{1}{2}\left[\frac{\text{imag}(\underline{V}_{Tkkp}) - (1 - d_{(2k-2)})\cdot\text{imag}(\underline{Z}_{1L(2k-2)}\underline{I}_{Tkkp})}{\text{imag}(I_F)}\right]$$

$$R_{(2k-1)F} = \frac{1}{2}\left[\frac{\text{real}(\underline{V}_{TkT(k+1)p}) - (1 - d_{(2k-1)})\cdot\text{real}(\underline{Z}_{1L(2k-1)}\underline{I}_{TkT(k+1)p})}{\text{real}(I_F)}\right] +$$
$$\frac{1}{2}\left[\frac{\text{imag}(\underline{V}_{TkT(k+1)p}) - (1 - d_{(2k-1)})\cdot\text{imag}(\underline{Z}_{1L(2k-1)}\underline{I}_{TkT(k+1)p})}{\text{imag}(I_F)}\right]$$

where:
$d_1$—distance to fault from the beginning of the line to the fault location,
$d_{(2n-3)}$—distance to fault from the end of the line to the fault location,
$d_{(2k-2)}$—distance to fault from the end of the tapped line to the fault location
$d_{(2k-1)}$—distance to fault in the line section between two tap points,
$\underline{V}_{1p}$—fault loop voltage calculated under assumption that fault occurred in the first section of the line section L1,
$\underline{I}_{1p}$—fault loop current calculated under assumption that fault occurred in the first section of the line section L1,
$\underline{V}_{T(n-1)np}$—fault loop voltage calculated under assumption that fault occurred in the line section L(2n-3),
$\underline{I}_{T(n-1)np}$—fault loop current calculated under assumption that fault occurred in the line section L(2n-3),
$\underline{V}_{Tkkp}$—fault loop voltage calculated under assumption that fault occurred in the $k^{th}$ tapped line,
$\underline{I}_{Tkkp}$—fault loop current calculated under assumption that fault occurred in $k^{th}$ tapped line,
$\underline{V}_{TkT(k+1)p}$—fault loop voltage calculated under assumption that fault occurred in the line section between two tap points,
$\underline{I}_{TkT(k+1)p}$—fault loop current calculated under assumption that fault occurred in the line section between two tap points,
$I_F$—total fault current,
$\underline{Z}_{1L1}$—impedance of line section L1 for the positive sequence component,
$\underline{Z}_{0L1}$—impedance of line section L1 for the zero sequence component,
$\underline{Z}_{1L(2n-3)}$—impedance of line section L(2n-3) for the positive sequence component,
$\underline{Z}_{0L(2n-3)}$—impedance of line section L(2n-3) for the zero sequence component,
$\underline{Z}_{1L(2k-2)}$—impedance of line section L(2k-2) for the positive sequence component,
$\underline{Z}_{0L(2k-2)}$—impedance of line section L(2k-2) for the zero sequence component,
$\underline{Z}_{1L(2k-1)}$—impedance of line section L(2k-1) for the positive sequence component,
$\underline{Z}_{0L(2k-1)}$—impedance of line section L(2k-1) for the zero sequence component,
k—number of the tap point
n—number of the line terminal.

8. The method of claim 1 further comprising determining modules of these impedances when it turns out that at least two values of the impedance of equivalent source systems concerning distance are contained in the first quadrant of the system by comparing the modules of impedance of equivalent source systems with realistic values which define the system load or supply, and determining the system load or supply when the distance for which the value of the module of the equivalent source impedance is nearest to the realistic values and the distance to the fault point is considered to be the final result.

9. A fault locator for finding a location of a fault in electric power lines of a transmission or a distribution system, in which division of the transmission or distribution system line into sections is used and a hypothetical location of the fault is assumed in at least one of these sections, said system having a predetermined number of terminal stations, said fault locator comprising:
models of faults and fault loops for symmetrical components and different types of faults;
said fault locator finding said location of a fault by:
calculating symmetrical components of current measured for a fault condition and a pre-fault condition in all of said predetermined number of terminal stations of the system and line phase voltage measured for fault and pre-fault conditions in one of said predetermined number of terminal stations of the system and the total fault current in the assumed hypothetical location of the fault,
assuming a first hypothetical location of the fault is located in a section of the electric power line between the beginning of the line and a first tap point, a second hypothetical location of the fault is located in a section of the electric power line between the end of the line and a last tap point of a branch of the electric power line, and a consecutive hypothetical location of a fault which is located in the branch,
calculating the distance from the beginning of the line to the fault located between the beginning of the line and the first tap point, the distance from the end of the line to the fault located between the end of the line and the last tap point of the branch of the line, the distance from the end of the line to the fault located in the branch, calculating resistances for each of said faults, selecting the actual location of a fault first by comparing the numerical values concerning the previously determined distances and rejecting the results whose numerical values are negative or bigger than one (1) in relative units and then by analyzing the values of the calculated fault resistances for said faults and rejecting those results of the calculations for which the value of fault resistance is negative, and if it is found that only one numerical value concerning the distance is contained in the numerical interval between zero and one in relative units and the value of calculated fault resistance for the distance to the fault point is positive or equal to zero, then these results are final and they indicate the actual distance to the fault point and the value of fault resistance in the fault point, determining impedance modules or impedances of equivalent source systems for the negative sequence component for phase-to-ground faults, phase-to-phase faults, and double phase-to-ground faults or for the incremental positive sequence component for three-phase faults when after the selection of the actual fault point it turns out that at least two numerical values concerning the previously calculated distances are contained within the numerical interval from zero to one in relative units and the values of the calculated fault resistances for these fault points are positive or equal to zero, and assuming that the fault occurred in a definite section, and during the impedance determination it is additionally checked whether the calculated values of the impedance of equivalent source systems are contained in the first quadrant of the Cartesian co-ordinate system for the complex plane and the previously calculated distances to fault locations are rejected for which impedance values are not contained in the first quadrant of the system, and if it turns out that only one value of the impedance of the equivalent source system concerning distance is contained in the first quadrant of the system, then the result of the calculation of the distance to the fault location, for the impedance, is considered to be final and said fault locator has found the location of the fault.

10. The method of claim 9 further comprising determining modules of these impedances when it turns out that at least two values of the impedance of equivalent source systems concerning distance are contained in the first quadrant of the system by comparing the modules of impedance of equivalent source systems with realistic values which define the system load or supply, and determining the system load or supply when the distance for which the value of the module of the equivalent source impedance is nearest to the realistic values and the distance to the fault point is considered to be the final result.

* * * * *